US011789097B2

(12) United States Patent
Hammerschmidt et al.

(10) Patent No.: US 11,789,097 B2
(45) Date of Patent: *Oct. 17, 2023

(54) MAGNETORESISTIVE SENSORS AND METHODS FOR GENERATING CLOSED FLUX MAGNETIZATION PATTERNS

(71) Applicant: Infineon Technologies AG, Neubiberg (DE)

(72) Inventors: Dirk Hammerschmidt, Finkenstein (AT); Armin Satz, Villach (AT); Juergen Zimmer, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 142 days.

This patent is subject to a terminal disclaimer.

(21) Appl. No.: 17/246,820

(22) Filed: May 3, 2021

(65) Prior Publication Data
US 2021/0255255 A1    Aug. 19, 2021

Related U.S. Application Data

(63) Continuation of application No. 16/001,060, filed on Jun. 6, 2018, now Pat. No. 11,009,568.

(30) Foreign Application Priority Data

Jun. 7, 2017    (DE) .................... 10 2017 112 546.9

(51) Int. Cl.
*G01R 33/09*    (2006.01)
*H01F 41/30*    (2006.01)
(Continued)

(52) U.S. Cl.
CPC ....... *G01R 33/093* (2013.01); *H01F 10/3254* (2013.01); *H01F 10/3272* (2013.01);
(Continued)

(58) Field of Classification Search
None
See application file for complete search history.

(56) References Cited

U.S. PATENT DOCUMENTS 6,768,152 B2    7/2004  Higo
7,697,243 B1    4/2010  Novosad et al.
(Continued)

FOREIGN PATENT DOCUMENTS

CN    101473372 A    7/2009
CN    102216995 A    10/2011
(Continued)

OTHER PUBLICATIONS

Machine English Translation of JP 2001-217479 to Namikata (Year: 2001).

*Primary Examiner* — Douglas X Rodriguez
(74) *Attorney, Agent, or Firm* — Harrity & Harrity, LLP

(57) ABSTRACT

A method for generating a closed flux magnetization pattern of a predetermined rotational direction in a magnetic reference layer of a magnetic layer stack is provided. The method includes applying an external magnetic field in a predetermined direction to the magnetic layer stack causing magnetic saturation of the magnetic reference layer and of a pinned layer of the magnetic layer stack; and reducing the external magnetic field to form a first closed flux magnetization pattern in the magnetic reference layer and a second closed flux magnetization pattern in the pinned layer.

22 Claims, 19 Drawing Sheets

(51) Int. Cl.
    *H01F 10/32*     (2006.01)
    *H10N 50/10*     (2023.01)
    *H10N 50/85*     (2023.01)

(52) U.S. Cl.
    CPC ......... *H01F 41/304* (2013.01); *H01F 41/308* (2013.01); *H10N 50/10* (2023.02); *H10N 50/85* (2023.02)

(56) References Cited

U.S. PATENT DOCUMENTS

| | | | |
|---|---|---|---|
| 8,018,690 B2 * | 9/2011 | Min | B82Y 10/00 360/324.12 |
| 8,257,596 B2 * | 9/2012 | Mather | G01R 33/093 216/22 |
| 10,989,769 B2 | 4/2021 | Zimmer et al. | |
| 11,009,568 B2 | 5/2021 | Hammerschmidt et al. | |
| 2003/0043503 A1 | 3/2003 | Grigoryevich et al. | |
| 2004/0062938 A1 | 4/2004 | Kai et al. | |
| 2004/0094785 A1 | 5/2004 | Zhu et al. | |
| 2007/0247901 A1 | 10/2007 | Akinaga et al. | |
| 2009/0080125 A1 | 3/2009 | Kondo | |
| 2010/0032778 A1 | 2/2010 | Lu et al. | |
| 2010/0078742 A1 * | 4/2010 | Zheng | G11C 11/161 257/E29.323 |
| 2010/0118447 A1 * | 5/2010 | Hammerschmidt | H01L 41/47 156/272.4 |
| 2014/0198564 A1 | 7/2014 | Guo | |
| 2015/0063019 A1 | 3/2015 | Dieny | |
| 2015/0185297 A1 | 7/2015 | Zimmer et al. | |

FOREIGN PATENT DOCUMENTS

| | | |
|---|---|---|
| CN | 103901364 B | 1/2017 |
| CN | 104749536 B | 12/2019 |
| DE | 10305823 A1 | 8/2003 |
| JP | S62104083 A | 5/1987 |
| JP | 2001217479 A | 8/2001 |
| TW | 200625305 A | 7/2006 |

* cited by examiner

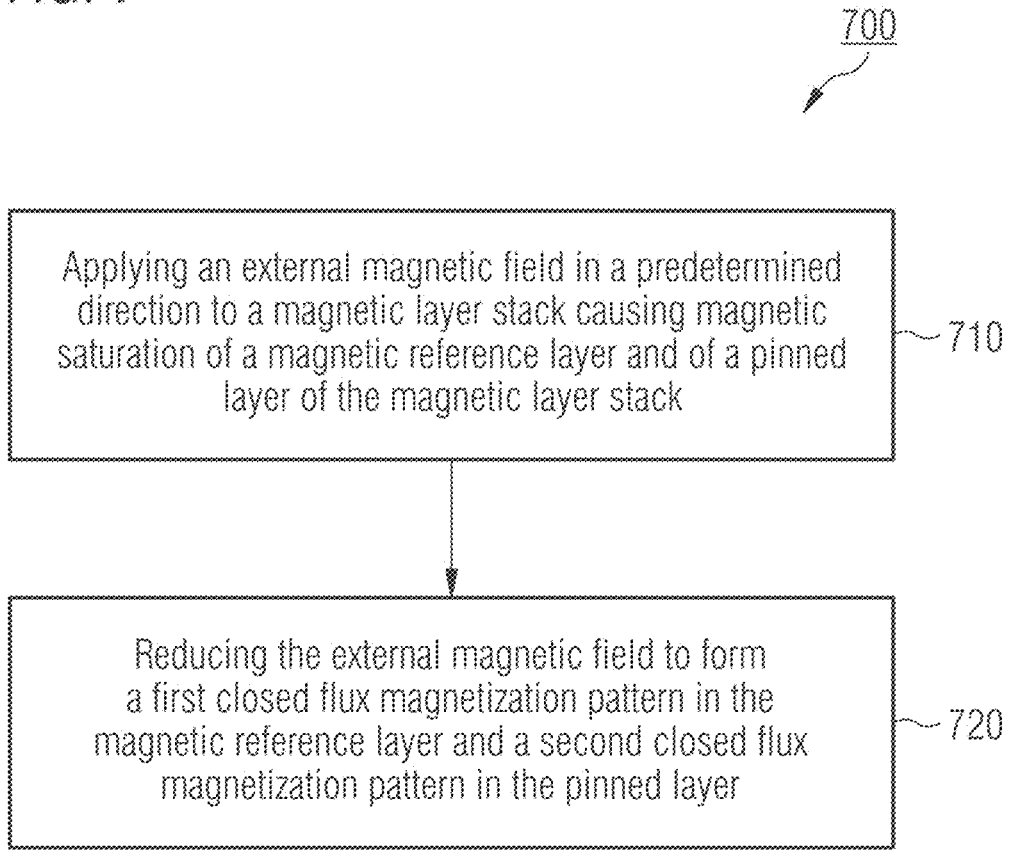

US 11,789,097 B2

MAGNETORESISTIVE SENSORS AND METHODS FOR GENERATING CLOSED FLUX MAGNETIZATION PATTERNS

CROSS-REFERENCE TO RELATED APPLICATIONS

This application is a continuation of U.S. patent application Ser. No. 16/001,060 filed Jun. 6, 2018, which claims the benefit of German Patent Application No. 10 2017 112 546.9 filed Jun. 7, 2017, which are incorporated by reference as if fully set forth.

FIELD

The present disclosure relates to magnetoresistive sensors and methods for generating a closed flux magnetization pattern in a magnetic reference layer of a magnetic layer stack.

BACKGROUND

Magnetoresistive effects are based on numerous different physical phenomena. All of these phenomena haveer in common that an electrical resistance of a resistive element is alterable by a magnetic field penetrating the resistive element. Technologies utilizing magneto-resistive effects are sometimes referred to as "xMR technologies", whereby the "x" indicates that a multitude of effects may be addressed here, like the Giant Magneto-Resistive (GMR) effect, the Tunnel Magneto-Resistive (TMR) effect, or the Anisotropic Magneto-Resistive (AMR) effect, to mention just a few examples. xMR effects may be applied in a variety of field-based magnetoresistive sensors, for example for measuring revolution, angles, etc.

Magnetoresistive sensors often include one or more magnetoresistors with fixed reference magnetizations for measuring the magnitude and/or direction of an external magnetic field. Manufacturing of these magnetoresistive sensors often requires local magnetization processes of the magnetoresistors. This can be cumbersome as the local magnetization processes often have to be carried one after the other, which can be time-consuming and hence costly. Therefore, new concepts of magnetoresistive sensors are sought which ease manufacturing and decrease manufacturing costs while keeping a high and accurate sensor performance. Such a demand may at least be partially satisfied by the subject matter of the present disclosure.

SUMMARY

According to a first aspect of the present disclosure, it is provided a magnetoresistive sensor. The magnetoresistive sensor includes a magnetic reference layer. The magnetic reference layer includes a (e.g. permanent) closed flux magnetization pattern of a predetermined rotational direction. Furthermore, the magnetoresistive sensor includes a magnetic free layer. The magnetic free layer has a total lateral area that is smaller than a total lateral area of the magnetic reference layer. A centroid of the magnetic free layer is laterally displaced with respect to a centroid of the magnetic reference layer.

According to a second aspect of the present disclosure, it is provided a method for generating a (e.g. permanent) closed flux magnetization pattern of a predetermined rotational direction in a magnetic reference layer of a magnetic layer stack. The method includes applying an external magnetic field in a predetermined direction to the magnetic layer stack causing magnetic saturation of the magnetic reference layer and of a pinned layer of the magnetic layer stack. Furthermore, the method includes reducing the external magnetic field to form a first closed flux magnetization pattern in the magnetic reference layer and a second closed flux magnetization pattern in the pinned layer.

BRIEF DESCRIPTION OF THE DRAWINGS

Some examples of apparatuses and/or methods will be described in the following by way of example only, and with reference to the accompanying figures, in which

FIG. 7 shows a flow chart of a method for generating a permanent closed flux magnetization pattern of a predetermined rotational direction in a magnetic reference layer of a magnetic layer stack according to one or more embodiments.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
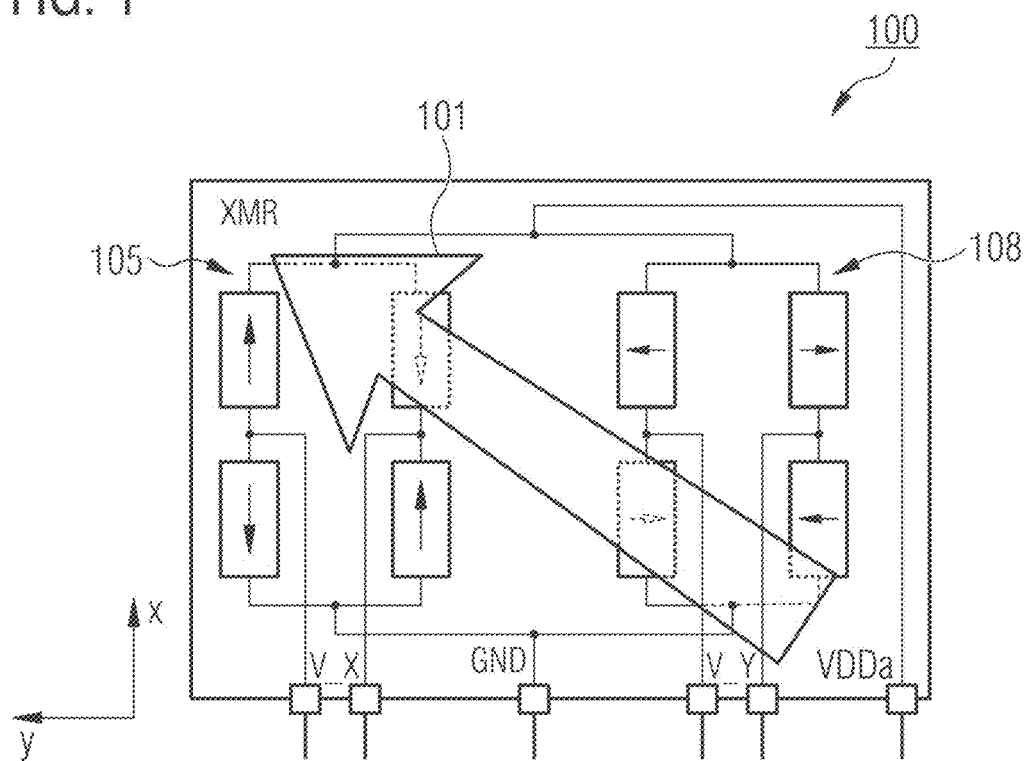
FIG. 1 shows a circuit schematic of a magnetoresistive sensor according to one or more embodiments.

Introductorily, FIG. 1 shows a circuit schematic of a magnetoresistive sensor 100 based on an xMR effect. The magnetoresistive sensor 100 can be used as an angle sensor to measure the direction of an externally imposed magnetic field 101. The magnetoresistive sensor 100 comprises a first bridge circuit 105 and a second bridge circuit 108 (or may alternatively comprise at least two half bridge circuits). Both the first and the second bridge circuit 105, 108 are connected to a common supply voltage $V_{DDa}$ and to a common ground potential GND. The first bridge circuit 105 can deliver measurements of an x-component of the externally imposed magnetic field 101. The second bridge circuit 108 can deliver measurements of a y-component of the externally imposed magnetic field 101. As indicated by the coordinate system in FIG. 1, the x- and the y-component of the externally imposed magnetic field 101 are orthogonal with respect to each other and are in parallel to a chip surface (e.g., to the surface of the first and the second bridge circuit 105, 108) of the magnetoresistive sensor 100. The first bridge circuit 105 comprises two magnetoresistors with reference magnetizations in x-direction and two magnetoresistors with reference magnetizations in opposite x-direction as indicated by the arrows inside the magnetoresistors of the first bridge circuit 105. A bridge voltage $V_x$ of the first bride circuit 105 can then be indicative for a magnitude $B_x$ of the x-component of the externally imposed magnetic field 101.

Analogously, the second bridge circuit 108 comprises two magnetoresistors with reference magnetizations in y-direction and two magnetoresistors with reference magnetizations in opposite y-direction as indicated by the arrows inside the magnetoresistors of the second bride circuit 108. A bridge voltage $V_y$ of the second bride circuit 108 can then be indicative for a magnitude $B_y$ of the y-component of the externally imposed magnetic field 101.

If the magnetoresistive sensor 100 is based on the GMR effect or on the TMR effect, the magnetoresistive sensor 100 can be used for unambiguously measuring the direction of the externally imposed magnetic field 101 within 360°. An AMR magnetoresistive sensor may measure the direction of the externally imposed magnetic field 101 unambiguously within 180°. The direction (or angle) of the externally imposed magnetic field 101 can be calculated from arctan $(B_y/B_x)$. To this end, the magnetoresistive sensor 100 may comprise an evaluation circuit (not shown in FIG. 1).

Optionally, a safety measure may be provided, in which the magnitude $\sqrt{B_x^2+B_y^2}$ of the externally imposed magnetic field 101 is monitored, which, assuming an externally imposed magnetic field constant in magnitude as given in many applications, should be constant after calibration and temperature compensation of both sensor signal components (e.g., the bridge voltages $V_x$ and $V_y$). However, this check may have a limited accuracy and might not reach very high diagnostic coverages due to its dependence on absolute values.

The local magnetization processes for providing the reference magnetizations of the magnetoresistors of the first and the second bridge circuit 105 and 108 can comprise applying a local heating with a laser within an external magnetic field of the desired direction (e.g., the desired direction of reference magnetization of a magnetoresistor). Each magnetoresistor may be magnetized locally to its pinning direction (e.g., to its direction of reference magnetization) in a heated state separately. This process might be time-consuming and therefore costly.

Figure 2A:
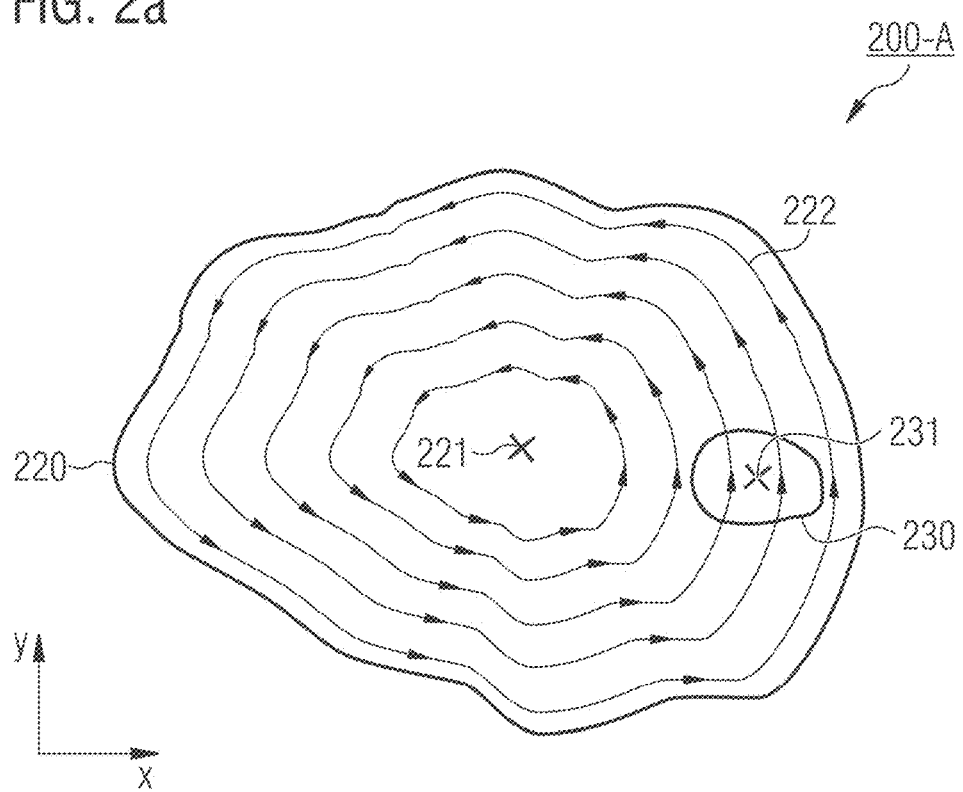
FIGS. 2a and 2b show schematic top views of magnetoresistive sensors according to one or more embodiments.

At least some embodiments according to the present disclosure can overcome and/or circumvent this time-consuming and costly magnetization process. FIG. 2a shows a schematic top view of a magnetoresistive sensor 200-A according to an embodiment. The magnetoresistive sensor 200-A comprises a magnetic reference layer 220. The magnetic reference layer 220 comprises a permanent closed flux magnetization pattern 222 of a predetermined rotational direction. Furthermore, the magnetoresistive sensor 200-A comprises a magnetic free layer 230. The magnetic free layer 230 has a total lateral area that is smaller than a total lateral area of the magnetic reference layer 220. A centroid 231 of the magnetic free layer 230 is laterally displaced with respect to a centroid 221 of the magnetic reference layer 220.

The closed flux magnetization pattern 222 is permanent and of a predetermined rotational direction. However, locally the direction of the magnetic field (and the magnetic flux density associated with this magnetic field) changes inside the magnetic reference layer 220. This changing of the direction of the magnetic field can be used to provide a desired direction of reference magnetization with respect to the magnetic free layer 230. This is possible, because the magnetic free layer 230 has a total lateral area smaller than that of the magnetic reference layer 220 and because the centroid 231 of the magnetic free layer 230 is laterally displaced with respect to the centroid 221 of the magnetic reference layer 220. The magnetic free layer 230 (or a part of the magnetic free layer 230) can then be positioned vertically above (or, depending on the build-up of the magnetoresistive sensor 200-A, vertically below) a portion of the magnetic reference layer 220 providing the desired direction of reference magnetization. In other words, the location (e.g., the x- and y-coordinates as indicated by the coordinate system in FIG. 2a) of the magnetic free layer 230 vertically above (or alternatively vertically below) the magnetic reference layer 220 may determine the direction of reference magnetization for a magnetoresistor of the magnetoresistive sensor 200-A comprising the magnetic free layer 230 (or a part of the magnetic free layer 230).

Within the context of the present disclosure, different parts of a layer (e.g., the magnetic reference layer 220 and/or the magnetic free layer 230) are understood as being laterally separated from each other and being each laterally surrounded by electrically insulating material (e.g., solid electrically insulating material and/or cavities). For example, different parts of a layer may be generated during production of the magnetoresistive sensor 200-A by structuring the layer using a photolithographic process. Different portions of a layer (e.g., the magnetic reference layer 220 and the magnetic free layer 230) can be laterally directly adjacent to each other and are used hereinabove for describing different shapes of a layer or a part of a layer. A part of a layer may comprise one or more portions. Furthermore, the total lateral area of a layer (e.g., the magnetic reference layer 220 or the magnetic free layer 230) can be the sum of the lateral areas of all parts of the layer.

Figure 2B:
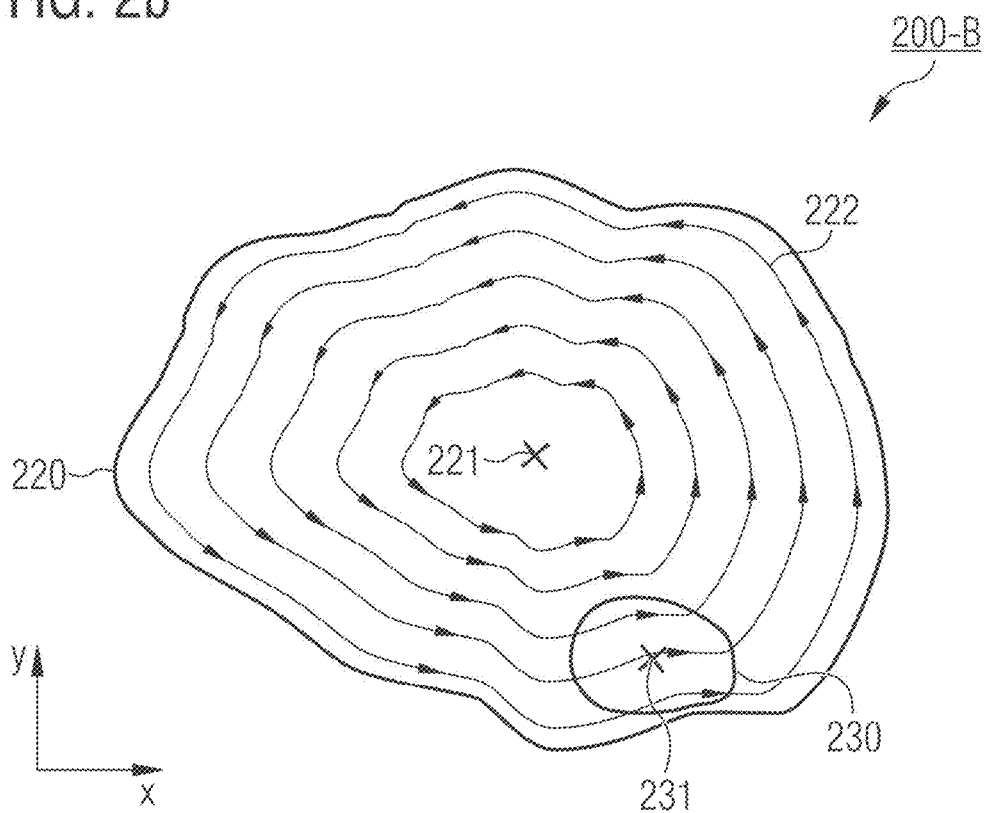

A magnetoresistor comprising the magnetic free layer 230 of the magnetoresistive sensor 200-A may have a reference magnetization primarily in y-direction, for example, whereas a magnetoresistor comprising the magnetic free layer 230 of the magnetoresistive sensor 200-B shown in FIG. 2b may have a reference magnetization primarily in x-direction. Since in this way the direction of reference magnetization of a magnetoresistor can be defined by the position of the magnetic free layer 230 relative to the magnetic reference layer 220, local magnetization processes of the magnetic reference layer for providing directions of reference magnetization may be avoided during manufacturing. This can reduce manufacturing time and costs for the magnetoresistive sensor 200-A/B.

The centroid 221 (e.g., the geometrical center) of the magnetic reference layer 220 and the centroid 231 of the magnetic free layer 230 can be understood as a center of the magnetic reference layer 220 and the magnetic free layer 230, respectively, also for asymmetric shapes (e.g., asymmetric lateral cross sections) of the magnetic reference layer 220 and the magnetic free layer 230. The centroid 221 of the magnetic reference layer 220 can be defined as the arithmetic mean position of all the points in the magnetic reference layer 220 and may be located inside or outside the magnetic reference layer 220 depending on the shape of the magnetic reference layer 220. Likewise, the centroid 231 of the magnetic free layer 230 can be defined as the arithmetic mean position of all the points in the magnetic free layer 231 and may be located inside or outside the magnetic free layer 230 depending on the shape of the magnetic free layer 230.

If, for example, the magnetic free layer 230 comprises two or more parts that are laterally separated from each other, respective centroids of the parts of the magnetic free layer 230 may be laterally displaced with respect to the centroid of the magnetic reference layer 220. If additionally the magnetic reference layer comprises two or more parts that are laterally separated from each other, respective centroids of the parts of the magnetic free layer 230 may be laterally displaced with respect to respective centroids of the parts of the magnetic reference layer 220. Laterally separated parts of the magnetic free layer 230 may each be laterally surrounded with electrically insulating material. Likewise, laterally separated parts of the magnetic reference layer 220 may each be laterally surrounded with electrically insulating material.

A lateral displacement of the centroid 231 of the magnetic free layer 230 with respect to the centroid 221 of the magnetic reference layer 220 may be larger than at least 5% (or at least 10%, or at least 20%) of a maximal lateral extension of the magnetic free layer 230. A larger lateral displacement may provide a more distinct direction of reference magnetization.

The closed flux magnetization pattern 222 vertically above or below at least a part of the magnetic free layer 230 can have an average magnetic flux density component in parallel to the magnetic free layer 230 (i.e. parallel to the x-y-plane of the free layer) that is different from zero. The part of the magnetic free layer can be laterally surrounded by electrically insulating material.

That is to say, a magnetoresistor of the magnetoresistive sensor 200-A/B may comprise the magnetic free layer 230 or a part of the magnetic free layer 230 laterally surrounded by electrically insulating material. Depending on the buildup of a magnetic layer stack of the magnetoresistive sensor 200-A/B, the magnetic reference layer 220 can be located above or below the magnetic free layer 230. The part of the magnetic reference layer's magnetic field 222 that is located vertically above (or vertically below, respectively) the magnetic free layer 230 (or its part) may determine a reference magnetization for the magnetoresistor. For a distinct reference magnetization, the magnetic field 222 running inside the magnetic reference layer 220 vertically above (or vertically below) the magnetic free layer 230 (or its part) may have a non-zero average magnetic flux density component in parallel (e.g., in the xy-plane) to the magnetic free layer 230. Elsewise, there would be as many magnetic field lines running in x-direction and in y-direction vertically above (or vertically below) the magnetic free layer 230 (or its part) as there would be running in negative x-direction and in negative y-direction, respectively. The average magnetic field vertically above (or vertically below) the magnetic free layer 230 (or its part) would then be zero and a distinct reference magnetization of the magnetoresistor would not exist. However, according to examples of the present disclosure, the lateral displacement of the centroid 231 of the magnetic free layer 230 (or of a part of the magnetic free layer 230) with respect to the magnetic reference layer 220 (or with respect to a part of the magnetic reference layer 220) may cause the closed flux magnetization pattern 222 vertically above (or vertically below) the magnetic free layer 230 (or a part of it) to have an average magnetic flux density component in parallel to the magnetic free layer 230 different from zero.

Optionally, a direction of the closed flux magnetization pattern 222 vertically above or below at least a part of the magnetic free layer 230 may change by at most 90° (or by at most 60°, or by at most 45°, or by at most 30°), the part of the magnetic free layer 230 being laterally surrounded by electrically insulating material. The less the direction of the closed flux magnetization pattern 222 vertically above (or vertically below) the magnetic free layer (or parts of it) changes, the more distinct the direction of reference magnetization provided to the magnetic free layer (or to its parts) can be.

Since the closed flux magnetization pattern 222 is permanent, it can be present inside the magnetic reference layer 220 independent of an operating state (e.g., an on-state or an off-state) of the magnetoresistive sensor 200-A/B. The predetermined rotational direction can, for instance, be a clockwise or a counterclockwise direction in the xy-plane of the magnetic reference layer 220. That is to say, the closed flux magnetization pattern 222 may be in-plane with the magnetic reference layer 220. Neglecting magnetic flux leakage effects, the magnetic reference layer 220 may enclose the closed flux magnetization pattern 222. Magnetic field lines running inside the magnetic reference layer 220 may then follow loops that are enclosed by the magnetic reference layer 220. The predetermined rotational direction of the closed flux magnetization pattern 222 may ensure that the desired direction of reference magnetization with respect to the magnetic free layer can be provided.

The magnetoresistive sensor 200-A/B may additionally comprise a natural antiferromagnetic layer and a pinned layer. The natural antiferromagnetic layer and the pinned layer can support establishing a permanent magnetization pattern in the magnetic reference layer 220. The pinned layer can be disposed between the natural antiferromagnetic layer and the magnetic reference layer 220. An optional coupling layer may be disposed between the pinned layer and the magnetic reference layer 220. The natural antiferromagnetic layer, the pinned layer, the optional coupling layer and the magnetic reference layer may be different layers of a magnetic layer stack of the magnetoresistive sensor 200-A/B and may be referred to as a magnetic reference system of the magnetoresistive sensor 200-A/B as they may jointly be responsible for defining the reference magnetization pattern (i.e., the closed flux magnetization pattern) in the magnetic reference layer 220.

Figure 2C:
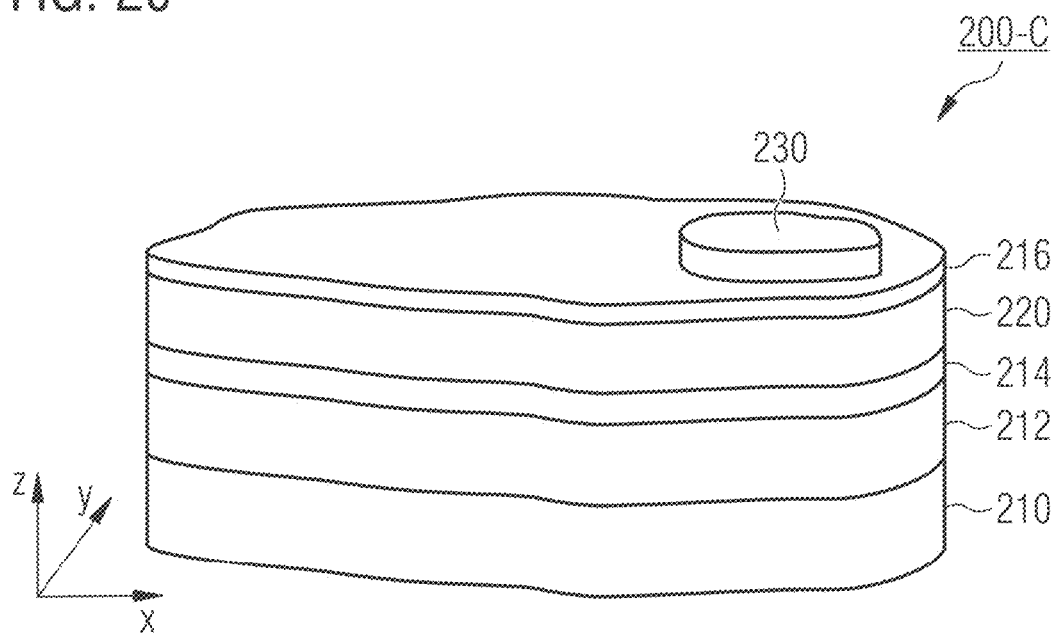
FIG. 2c shows a magnetic layer stack of a magnetoresistive sensor according to one or more embodiments.

FIG. 2c shows an example of a magnetic layer stack 200-C of a magnetoresistive sensor according to an example. For instance, the magnetic layer stack 200-C can be arranged on a semiconductor substrate (not shown) of the magnetoresistive sensor. If described in a Cartesian coordinate system with pair-wise perpendicular coordinate axes x, y, and z, the layers each extend laterally in a plane spanned by the x and y axes. Hereinabove, lateral dimensions (e.g., lateral distances, lateral cross sectional areas, lateral areas, lateral extensions, lateral displacements, etc.) refer to dimensions in the xy-plane. Vertical dimensions refer to dimensions in z-direction, perpendicular to the xy-plane. For example, the (vertical) extent of a layer in z-direction may be described as the layer thickness.

From the bottom up, the magnetic layer stack 200-C comprises a natural antiferromagnetic (NAF) layer 210 and a ferromagnetic pinned layer 212. Contact between the natural antiferromagnetic layer 210 and the pinned layer 212 can provoke an effect known as exchange bias effect, causing the magnetization of the pinned layer 212 to align in a preferred direction. The pinned layer 212 can comprise a closed flux magnetization pattern in the xy-plane. This closed flux magnetization pattern of the pinned layer 212 may be generated during manufacturing of the magnetic layer stack 200-C (as explained below) and may be permanent. The magnetic layer stack 200-C further comprises a coupling layer 214. The coupling layer 214 may be diamagnetic and comprise ruthenium, iridium, copper and/or copper alloys and similar materials, for example. The coupling layer 214 spatially separates the pinned layer 212 from the magnetic (e.g., ferromagnetic) reference layer 220. Using this build-up, the magnetization of the magnetic reference layer 220 may align and be held in a direction anti-parallel to the magnetization of the pinned layer 212. For example, if the pinned layer 212 comprises a clockwise closed flux magnetization pattern in the xy-plane, the magnetic reference layer 220 may comprise a counterclockwise closed flux magnetization pattern in the xy-plane (or vice versa). In this way, the magnetic reference layer 220 can have a permanent closed flux magnetization pattern.

The magnetic layer stack 200-C additionally comprises a non-magnetic layer 216 and a magnetic free layer 230. The non-magnetic layer 216 is disposed between the magnetic reference layer 220 and the magnetic free layer 230. The magnetic free layer 230 has a total lateral area smaller than a total lateral area of the magnetic reference layer 220. A centroid of the magnetic free layer 230 is laterally displaced with respect to a centroid of the magnetic reference layer 220. The magnetic free layer 230 can comprise a linear magnetization pattern or a closed flux magnetization pattern (e.g., a vortex magnetization pattern). Furthermore, the magnetization of the magnetic free layer 230 may follow an externally imposed magnetic field.

According to some embodiments, the non-magnetic layer 216 may be electrically conducting (e.g., comprise copper, silver, gold, tungsten, aluminum, and/or alloys thereof). In this case, the magnetoresistive sensor comprising the magnetic layer stack 200-C can be a giant-magneto-resistive (GMR) sensor. Alternatively, the non-magnetic layer 216 may be an electrically insulating tunnel barrier layer. The magnetoresistive sensor comprising the magnetic layer stack 200-C may then be a tunnel-magneto-resistive (TMR) sensor.

The magnetic free layer 216, the magnetic reference layer 220, and the pinned layer 212 may in some embodiments comprise iron, cobalt, or nickel, and in some further embodiments alloys of these. Alloys may also comprise non-ferromagnetic materials, e.g., carbon, boron, nitrogen, and/or oxygen, with ferromagnetic materials constituting at least 50% of a material composition of the respective layer. For example, layers may comprise cobalt-iron (CoFe), cobalt-iron-boron (CoFeB), or nickel-iron (NiFe) alloys. In contrast, the natural antiferromagnetic layer 210 may comprise iridium, manganese, platinum, and/or alloys comprising these, for example.

During operation of a TMR sensor, or when the magnetic layer stack 200-C is coupled to an electric circuit, electrical charges may pass from one side of the tunnel barrier layer 216 to the other in a predetermined amount if a constant external magnetic field is applied. The TMR effect is a quantum physical phenomenon expressing itself in a change of the amount of charges passing the tunnel barrier layer 216 when the direction of the external magnetic field is changed. This effect may arise due to directional changes of the magnetization of the magnetic free layer 230 with regard to the magnetization of the reference layer magnetization caused by the changing external magnetic field. For example, the external magnetic field may align the magnetization of the magnetic free layer 230 in the direction of the (average) magnetization of a portion of the magnetic reference layer 220 located vertically below the magnetic free layer 230. A higher amount of electrical charges may then pass through the tunnel barrier layer 216 as when the external magnetic field has a different direction that aligns the magnetization of the magnetic free layer 230 antiparallel (e.g., opposite) to the magnetization of said portion of the magnetic reference layer 220.

Examples of magnetoresistive sensors of the present disclosure may comprise the magnetic layer stack 200-C of FIG. 2c and/or similar magnetic layer stacks. Magnetoresistive sensors are not limited to the GMR or TMR effect. Other examples of the present disclosure can comprise structures based on other xMR effects. The magnetic layer stack 200-C may correspond to a magnetoresistor as employed by at least some embodiments of this disclosure.

Figure 2D:
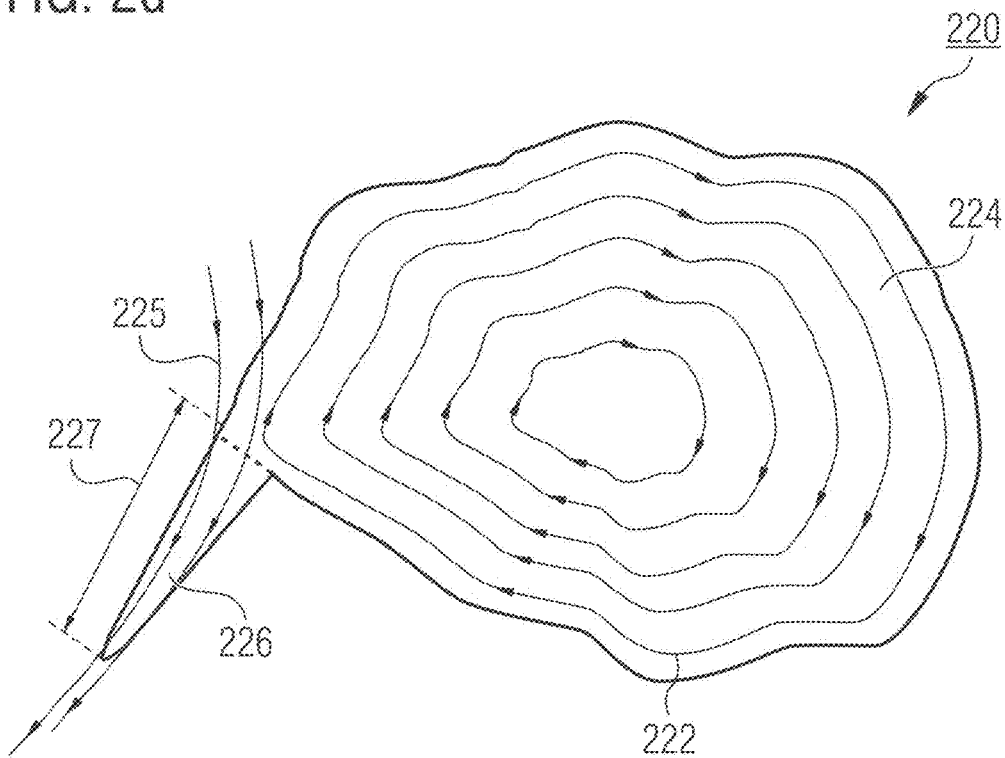
FIG. 2d shows a lateral cross section of a magnetic reference layer with a main portion and a protrusion portion according to one or more embodiments.

Various means may be employed for providing a predetermined rotational direction of the closed flux magnetization pattern 222 of the magnetic reference layer 220. For example, a lateral cross section of the magnetic reference layer 220 (and/or of an optional pinned layer) may have a shape that can support the implementation of a predetermined rotational direction of the closed flux magnetization pattern 222. The magnetic reference layers 220 shown in FIGS. 2a-2c have generic lateral cross sections not exemplifying any particular shape. As illustrated in FIG. 2d however, the magnetic reference layer 220 can optionally comprise a main portion 224 and a protrusion portion 226. The protrusion portion 226 can be laterally adjacent (e.g., directly laterally adjacent) to the main portion 224. The main portion 224 can comprise the closed flux magnetization pattern 222. A magnetization pattern 225 of the protrusion portion 226 can be configured to predetermine the rotational direction of the closed flux magnetization pattern 222.

As shown in FIG. 2d, the protrusion portion 226 can extend laterally out of the main portion 224. Alternatively, the magnetic reference layer can comprise a lateral slot (not shown in FIG. 2d). The lateral slot can be laterally located between the main portion and the protrusion portion. For example, the lateral slot may extend from a perimeter of the magnetic reference layer laterally into (but not through) the magnetic reference layer to shape the magnetic reference layer into the main portion and the protrusion portion.

In proximity to a lateral joining of the protrusion portion 226 and the main portion 224 (as indicated by the dashed line in FIG. 2d), the magnetization pattern 225 of the protrusion portion 226 can be directed (substantially) opposite to the closed flux magnetization pattern 222 of the main portion 224. For example, with aid of an external magnetic field applied to the magnetic reference layer 220 in a predetermined direction during manufacturing, a closed flux magnetization pattern 222 of a predetermined rotational direction may be generated inside the main portion 224. The external magnetic field applied to the magnetic reference layer 220 during manufacturing may have a direction along the protrusion portion 226. The protrusion portion 226 may then be magnetized in the direction of the external magnetic field applied during manufacturing. After removal (or reduction) of this external magnetic field, a closed flux magnetization pattern 222 may form inside the main portion 224 and may align in opposite direction to the magnetization pattern 225 of the protrusion portion 226 at the lateral joining of the protrusion portion 226 and the main portion 224. The local direction of the closed flux magnetization pattern 222 at the lateral joining may then set the rotational direction of the closed flux magnetization pattern 222. Since the magnetization of the protrusion portion 226 can be permanent, the protrusion portion 226 may keep the closed flux magnetization pattern 222 permanently in its predetermined rotation direction.

According to some examples, a length 227 of the protrusion portion 226 can be larger than twice a width of the protrusion portion 226. This may additionally support implementing a predetermined rotational direction of the closed flux magnetization pattern 222 inside the main portion 224. The length 227 of the protrusion portion 226 may be defined as the maximal lateral distance of the protrusion portion 226 from a far end (with respect to the main portion 226) of the protrusion portion 226 to the main portion 226 (e.g., to the lateral joining of the protrusion portion 226 and the main portion 224). The width of the protrusion portion 226 may be defined as the lateral extension of the protrusion portion 226 in a direction perpendicular to the length 227 of the protrusion portion 226. As illustrated in FIG. 2d, the protrusion portion 226 can be of a triangular-like lateral shape, but can also be of different shapes, e.g., rectangular, polygonal or curved shapes.

A length (e.g., a maximal lateral extension) of the main portion 224 can be smaller than twice a width of the main portion 224. This can facilitate the forming of the closed flux magnetization pattern 222 inside the main portion 224. The width of the main portion 224 may be defined as the lateral extension of the main portion 224 in a direction perpendicular to the length of the main portion 224. In other words, while the protrusion portion 226 may have an elongated lateral cross section, the main portion 224 may have a non-elongated (e.g., a circular like or patch like) lateral cross section.

According to some examples, the main portion 224 has a rotationally symmetric lateral cross section. This can additionally support the generation of the closed flux magnetization pattern 222 inside the magnetic reference layer 220. For example, the main portion 224 can have an elliptical, a circular, a squared, or a regular polygonal lateral cross section.

Optionally (as shown in FIG. 2d), the protrusion portion 226 may extend tangentially to the main portion 224. This may further support predetermining the rotational direction of the closed flux magnetization pattern 222 inside the main portion 224 of the magnetic reference layer 220.

A minimal lateral distance between the magnetic free layer (not shown in FIG. 2d) and the protrusion portion 226 of the magnetic reference layer 220 can be larger than 10% (or larger than 25%) of a maximal lateral extension of the main portion 224. This way, a sufficient distance between the protrusion portion 226 and the magnetic free layer (or the part of the magnetic free layer laterally located the closest to the protrusion portion 226) can be provided, such that effects of the magnetization pattern 225 of the protrusion portion 226 on reference magnetizations of magnetoresistors of the magnetoresistive sensor may be negligible. In case a lateral slot is implemented, a minimum lateral distance between the magnetic free layer and the lateral slot can be larger than 10% (or larger than 25%) of a maximal lateral extension of the main portion.

Asymmetries of the magnetic reference layer 220 (and optionally of a pinned layer of a magnetoresistive sensor) like the protrusion portion 226 can be supportive to allow the formation of the closed flux magnetization pattern 222 (e.g., a vortex magnetization pattern) in a predefined rotational direction by means of exchange coupling if a decaying external magnetic field is applied during the formation (e.g., during manufacturing of the magnetoresistive sensor).

Figure 2E:
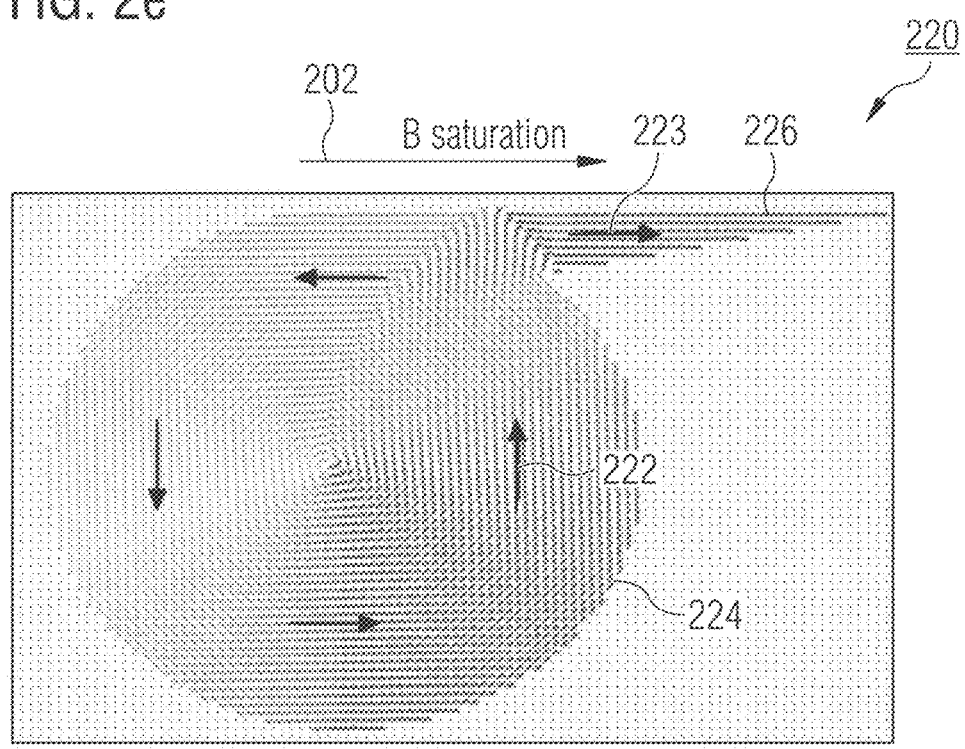
FIGS. 2e-2h show simulation results of magnetic fields in magnetic reference layers with a main portion and a protrusion portion according to one or more embodiments.

FIG. 2e shows an example for a structure (e.g., a lateral cross section of a magnetic layer stack) exhibiting a defined chirality of a magnetic reference layer 220 (and/or of a pinned layer) of a magnetic reference system of a magnetoresistive sensor after exposure to a saturation magnetic field 202 and relaxation in a low field for generation of a vortex-like (e.g., closed flux) magnetization pattern 222. The structure (e.g., the lateral cross sectional area of the magnetic reference layer 220) comprises a circular main portion 224 and an elongated protrusion portion 226. During exposure to the saturation magnetic field 202, the saturation magnetic field 202 may be applied such that it is aligned predominantly along the protrusion portion 226. The protrusion portion 226 can exhibit a high shape anisotropy which can substantially keep its magnetization 223 also after relaxation of the external magnetic field 202. Therefore, during the generation of the vortex-like magnetization of the magnetic reference layer 220, an additional, non-symmetric magnetic force can influence the vortex generation, thereby defining the vortex chirality (e.g., the rotational direction of the closed flux magnetization pattern 222).

In other words, the magnetization of the protrusion portion 226 can be substantially linear (or not closed inside the protrusion portion as indicated in FIG. 2d) and can cause the closed flux magnetization pattern 222 to align in an opposite direction to it at the lateral joining of the protrusion portion 226 and the main portion 224. This is shown in the micromagnetic simulations displayed in FIGS. 2e-2h. The closed flux magnetization pattern 222 (or vortex magnetization) near the protrusion portion 226 of the magnetic reference layer 220 is aligned anti-parallel to the magnetization 223 of the protrusion portion 226. As a result, the chirality (e.g., the rotational direction of the closed flux magnetization pattern 222) can be controlled by the geometry of the magnetic reference layer 220.

Figure 2F:
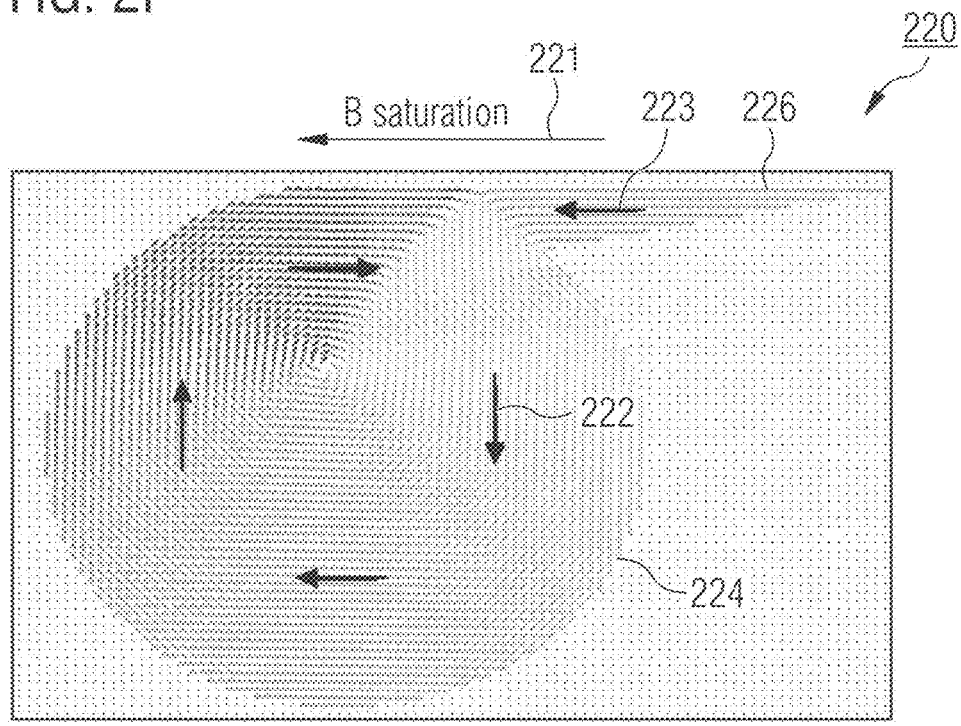
Figure 2G:
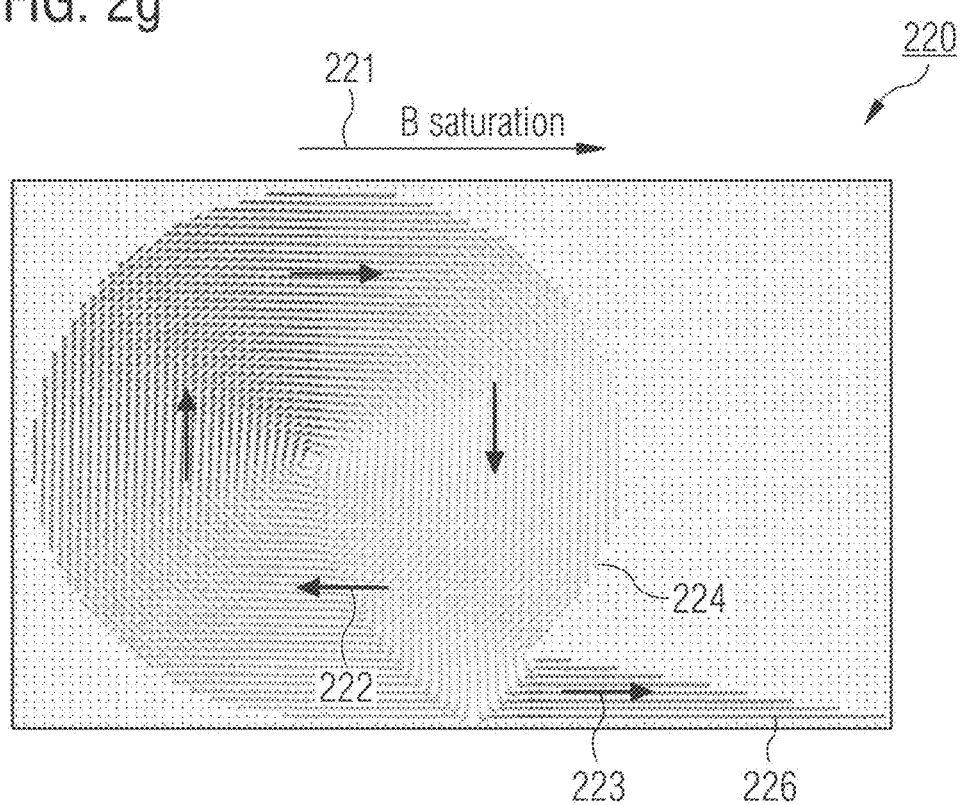
Figure 2H:
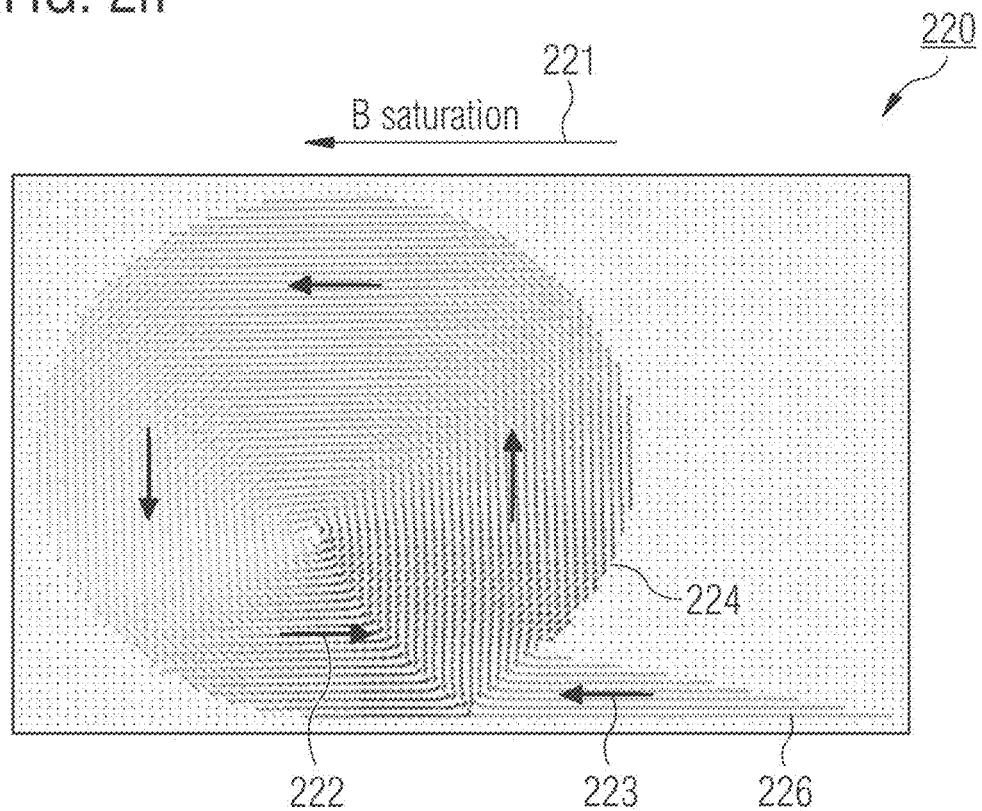

For example, FIGS. 2e-2f display chirality of the vortex depending on the initial saturation state for a protrusion portion 226 (e.g., a structure extension) at one side of the magnetic reference layer structure shape (or pinned layer structure shape). FIGS. 2g-2h display chirality of the vortex depending on the initial saturation state for a protrusion portion 226 at an opposite side of the magnetic reference layer structure shape (or pinned layer structure shape).

Figure 2I:
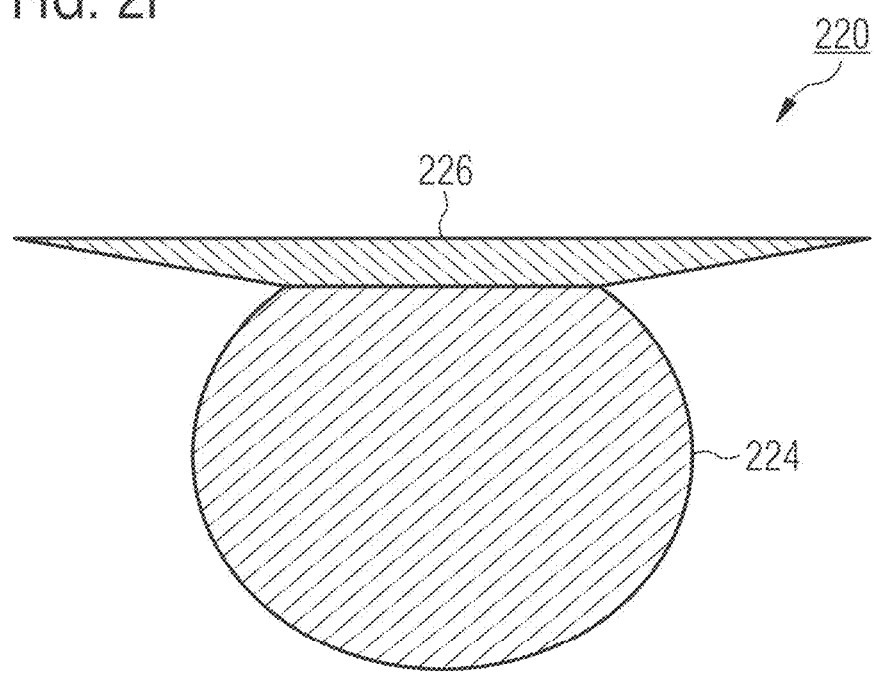
FIG. 2i shows a lateral cross section of another magnetic reference layer with a main portion and a protrusion portion according to one or more embodiments.

FIG. 2i displays a further structure example (e.g., a lateral cross section of a magnetic reference layer 220) with a structure extension (e.g., a protrusion portion 226). The effect may be similar to the structure with extension at the upper right as shown in FIGS. 2e-2f.

Turning back to the magnetoresistive sensor 200-A/B, the magnetic free layer 230 can comprise a first part and at least a second part. The second part can be laterally separated from the first part. For example, the first and the second part may be separated from each other by solid electrically insulating material or by a cavity inside a magnetic layer stack. During manufacturing of the magnetoresistive sensor 200-A/B, the first and the second part of the magnetic free layer 230 may be formed out of the magnetic free layer 230 using a photolithographic process, for instance. Separated parts of the magnetic free layer 230 can be used for implementing a plurality of magnetoresistors of the magnetoresistive sensor 200-A/B that share the same magnetic reference layer 220. For example, a first magnetoresistor of the magnetoresistive sensor 200-A/B may comprise the first part of the magnetic free layer 230 and a second magnetoresistor of the magnetoresistive sensor 200-A/B may comprise the second part of the magnetic free layer 230. This way, manufacturing of the magnetoresistive sensor 200-A/B can be made more efficient and hence manufacturing costs can be reduced. The first and the second part of the magnetic free layer 230 can be located vertically above (or vertically below) the same part of the magnetic reference layer 220. Alternatively, the first and the second part of the magnetic free layer 230 can be located vertically above (or vertically below) different parts of the magnetic reference layer 220, which are laterally separated from each other.

For example, vertically above (or, depending on the build-up of the magnetic layer stack, vertically below) the first part of the magnetic free layer 230, the direction of the magnetic reference layer's closed flux magnetization pattern 222 may be different to its direction vertically above (or vertically below, respectively) the second part of the magnetic free layer 230. Accordingly, different directions of reference magnetization can be provided for a first magnetoresistor comprising the first part of the magnetic free layer 230 with respect to a second magnetoresistor comprising the second part of the magnetic free layer 230. This can avoid local magnetization processes of the magnetoresistors.

The closed flux magnetization pattern 222 of the magnetic reference layer 220 may change its direction vertically above (or vertically below) the respective parts of the magnetic free layer 230. Therefore, the direction of reference magnetization for a magnetoresistor may rather be defined by an average direction taken on by the closed flux magnetization pattern 222 vertically above (or vertically below) the respective parts of the magnetic free layer 230. In other words, a first average direction of the closed flux magnetization pattern 222 (of the magnetic reference layer 220) vertically above (or vertically below) the first part of the magnetic free layer 230 can differ from a second average direction of the closed flux magnetization pattern 222 vertically above (or vertically below) the second part of the magnetic free layer 230.

For example, the first average direction can differ from the second average direction by at least 5 degree (or by at least 10 degree, or by at least 20 degree, or by at least 45 degree, or by at least 90 degree). A larger difference between the first and the second average direction of the closed flux magnetization pattern may facilitate measuring different directional components of an external magnetic field incident on the magnetoresistive sensor 200-A/B.

For example, the first average direction of the closed flux magnetization pattern 222 may coincide with x-direction and the second average direction of the closed flux magnetization pattern 222 may be orthogonal with respect to the first average direction and hence coincide with y-direction. Orthogonality can enable a reliable determination of the direction of an externally imposed magnetic field using the magnetoresistive sensor 200-A/B.

In a further example, the first average direction and the second average direction may be anti-parallel (i.e. may differ by approximately 180° from each other) to each other. Anti-parallel alignment of first and second average direction can enable a Wheatstone half-bridge configuration.

A respective average direction of the closed flux magnetization pattern 222 vertically above (or vertically below) a respective part of the magnetic free layer 230 can be determinable by integrating a first component of a magnetic flux density associated with the closed flux magnetization pattern 222 over a portion of the magnetic reference layer 220 and by integrating a second component of the magnetic flux density over this portion and by comparing the integrated first component and the integrated second component of the magnetic flux density. Said portion of the magnetic reference layer can extend from an upper surface to a lower surface of the magnetic reference layer 220 and can have a lateral area coinciding with a vertical projection of the respective part of the magnetic free layer 230 onto the magnetic reference layer 220. The first and the second component of the magnetic flux density can be orthogonal with respect to each other and can be in a plane parallel to the magnetic free layer 230 (e.g., in the xy-plane).

Figure 2J:
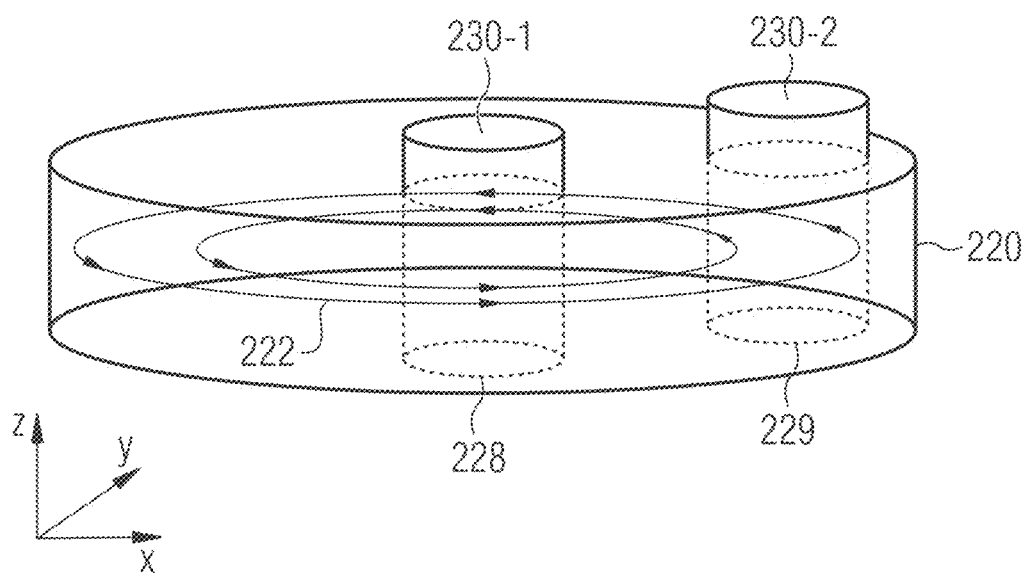
FIG. 2j shows a three dimensional view of a magnetic reference layer and a magnetic free layer comprising two laterally separated parts according to one or more embodiments.

This is explained in more detail with aid of FIG. 2j. FIG. 2j shows a schematic diagram of a magnetic reference layer 220 together with a magnetic free layer disposed above the magnetic reference layer 220 (an optional non-magnetic layer disposed between the magnetic reference layer 220 and the magnetic free layer is not shown). The magnetic free layer comprises a first part 230-1 and a second part 230-2. The second part 230-2 is laterally separated from the first part 230-1. Furthermore, FIG. 2j shows the closed flux magnetization pattern 222 of the magnetic reference layer

220. The closed flux magnetization pattern 222 takes on different average directions vertically below the first part 230-1 and the second part 230-2 of the magnetic free layer. To determine a respective average direction of the closed flux magnetization pattern 222 vertically below a respective part 230-1, 230-2 of the magnetic free layer, the x- and y-components (e.g., orthogonal components in a plane parallel to the magnetic free layer) of the magnetic flux density associated with the closed flux magnetization pattern 222 may be integrated over respective portions 228, 229 of the magnetic reference layer 220 that are located below the respective parts 230-1, 230-2 of the magnetic free layer.

That is to say, a first portion 228 of volume $V_1$ of the magnetic reference layer 220 extends from an upper to a lower surface of the magnetic reference layer 220 and has a lateral area coinciding with a vertical projection of the first part 230-1 of the magnetic free layer onto the magnetic reference layer 220. Likewise, a second portion 229 of volume $V_2$ of the magnetic reference layer extends from the upper to the lower surface of the magnetic reference layer 220 and has a lateral area coinciding with a vertical projection of the second part 230-2 of the magnetic free layer onto the magnetic reference layer 220. The average direction of the closed flux magnetization pattern 222 in a respective portion of the magnetic reference layer of Volume $V_i$ (e.g., i=1, 2) can then be determined by integrating the x-component $B_x$ (e.g., the first component) of the magnetic flux density and the y-component $B_y$ (e.g., the second component) of the magnetic flux density over the respective portion 228, 229 of the magnetic reference layer 220 according to Equation 1.1:

$$\overline{B_{x,i}} = \frac{1}{V_i} \int_{V_i} B_x(x, y, z) \, dV_i;$$

and Equation 1.2:

$$\overline{B_{y,i}} = \frac{1}{V_i} \int_{V_i} B_y(x, y, z) \, dV_i.$$

Comparison of the integrated (e.g., averaged) x-component $\overline{B_{x,i}}$ and the integrated (e.g., averaged) y-component $\overline{B_{y,i}}$ of the magnetic flux density can then yield the respective average direction $\varphi_i$ of the closed flux magnetization pattern 222 vertically below (or, depending on the build-up of the magnetic layer stack, vertically above) a respective part 230-1, 230-2 of the magnetic free layer. For the comparison, the inverse tangent function may be employed, so that the respective average direction $\varphi_i$ can be determined according to Equation 1.3:

$$\varphi_i = \begin{cases} \tan^{-1}(\overline{B_{y,i}}/\overline{B_{x,i}}), & \text{for } \overline{B_{x,i}} \geq 0 \text{ and } \overline{B_{y,i}} \geq 0; \\ \tan^{-1}(\overline{B_{y,i}}/\overline{B_{x,i}}) + 180°, & \text{for } \overline{B_{x,i}} < 0; \\ \tan^{-1}(\overline{B_{y,i}}/\overline{B_{x,i}}) + 360°, & \text{for } \overline{B_{x,i}} \geq 0 \text{ and } \overline{B_{y,i}} < 0. \end{cases}$$

For example, an average direction of $\varphi_i=0°$ coincides with x-direction, $\varphi_i=90°$ with y-direction, $\varphi_i=180°$ with negative x-direction, and $\varphi_i=270°$ with negative y-direction.

FIGS. 3a-3i show several examples of magnetoresistive sensors (in a top view) comprising a magnetic reference layer 320 with a permanent closed flux magnetization pattern 322 of a predetermined rotational direction and a magnetic free layer having a total lateral area smaller than a total lateral area of the magnetic reference layer 320. Centroids of the magnetic free layer 330 (or of different parts of the magnetic free layer 330-1, 330-2, 330-3, 330-4) are laterally displaced with respect to centroids of the magnetic reference layers 430 of the magnetoresistive sensors.

For example, for a TMR (or alternatively other xMR), the magnetic reference layer 320 (and optionally the pinned layer) of the TMR can comprise a vortex structure (e.g., a closed flux magnetization pattern 322). The magnetic free layer 330 of the TMR (or parts 330-1, 330-2, 330-3, 330-4 of the magnetic free layer) can be restricted to a region of the vortex-like magnetized magnetic reference layer 320 that has the wanted direction of reference magnetization. TMR elements (or alternatively other xMR elements) with different directions of reference magnetization can be realized by different placement of the magnetic free layer 330 (or of the parts 330-1, 330-2, 330-3, 330-4 of the magnetic free layer).

The magnetic free layer 330 can be structured differently, e.g. circular in order facilitate generating a vortex-like magnetization pattern as well or linear (e.g., rectangular or polygonal) in order to be magnetized substantially homogenously. Furthermore, the magnetic free layer 330 (or the parts 330-1, 330-2, 330-3, 330-4 of the magnetic free layer) can be magnetized homogeneously although the shape is circular-like, since the generation of a vortex-like magnetization pattern can be influenced by the thickness (e.g., the magnetic moment) of the magnetic free layer 330 as well as by the saturation magnetization of the material of the magnetic free layer 330.

Figure 3A:
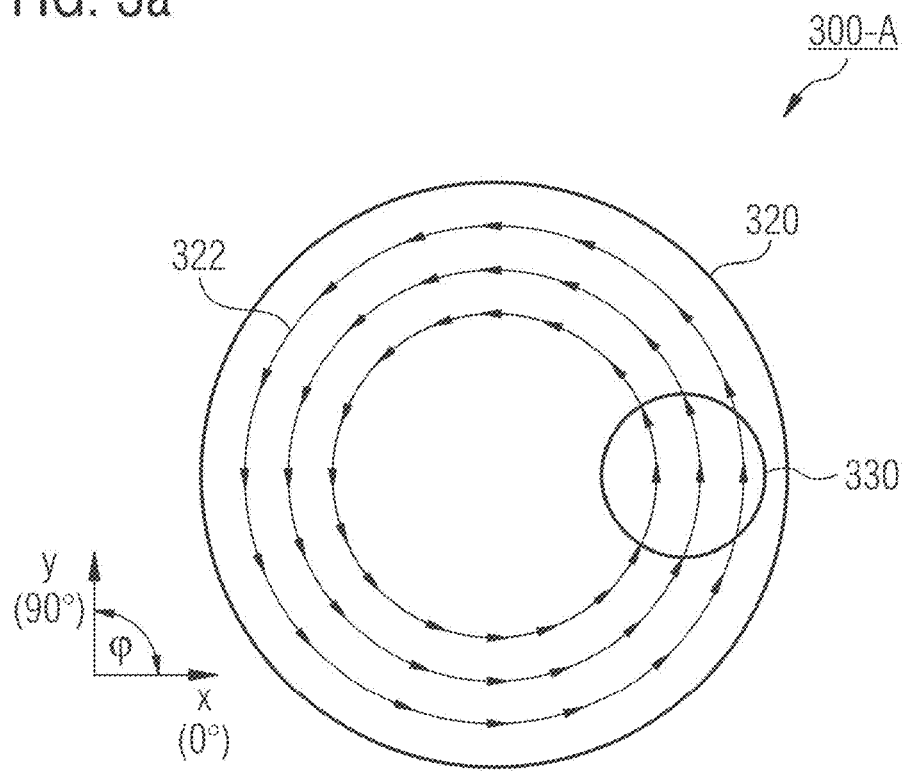
FIGS. 3a-3i show several examples of magnetoresistive sensors in a schematic top view according to one or more embodiments.

FIG. 3a shows a schematic top view of a magnetoresistive sensor 300-A comprising a magnetic reference layer 320 with a circular lateral cross sectional area and a closed flux magnetization patter 322. Furthermore, the magnetoresistive sensor 300-A comprises a magnetic free layer 330 with a circular lateral cross sectional area. The magnetic free layer 330 is arranged vertically above (or vertically below) the magnetic reference layer 320 such that an average direction of the closed flux magnetization pattern 322 vertically above (or vertically below) the magnetic free layer 330 points predominantly in y-direction (i.e., in $\varphi=90°$ direction) as indicated by the coordinate system shown in FIG. 3a.

Figure 3B:
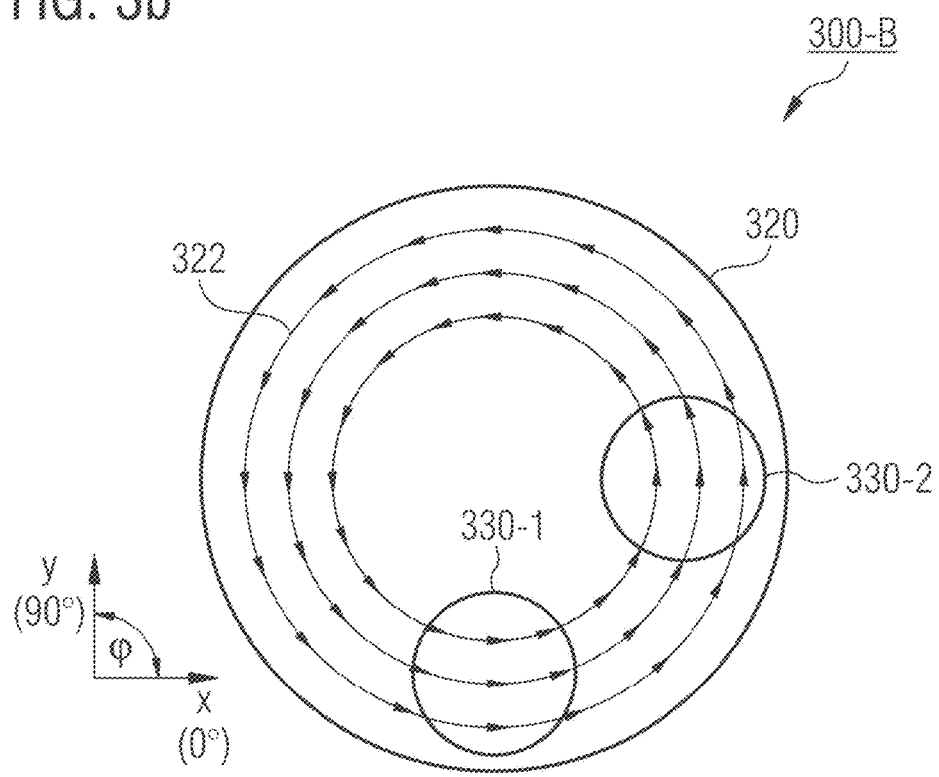

The magnetoresistive sensor 300-B shown in FIG. 3b is similar to that of FIG. 3a, however, the magnetic free layer comprises a first part 330-1 and a second part 330-2 that is laterally separated from the first part 330-1. Both the first and the second part 330-1, 330-2 of the magnetic free layer comprise circular lateral cross sectional areas. A first average direction of the closed flux magnetization pattern 322 vertically above (or vertically below) the first part 330-1 of magnetic free layer points predominantly in x-direction (i.e., in $\varphi=0°$ direction). A second average direction of the closed flux magnetization pattern 322 vertically above (or vertically below) the second part 330-2 of the magnetic free layer is orthogonal with respect to the first average direction and points predominantly in y-direction (i.e., in $\varphi=90°$ direction).

Figure 3C:
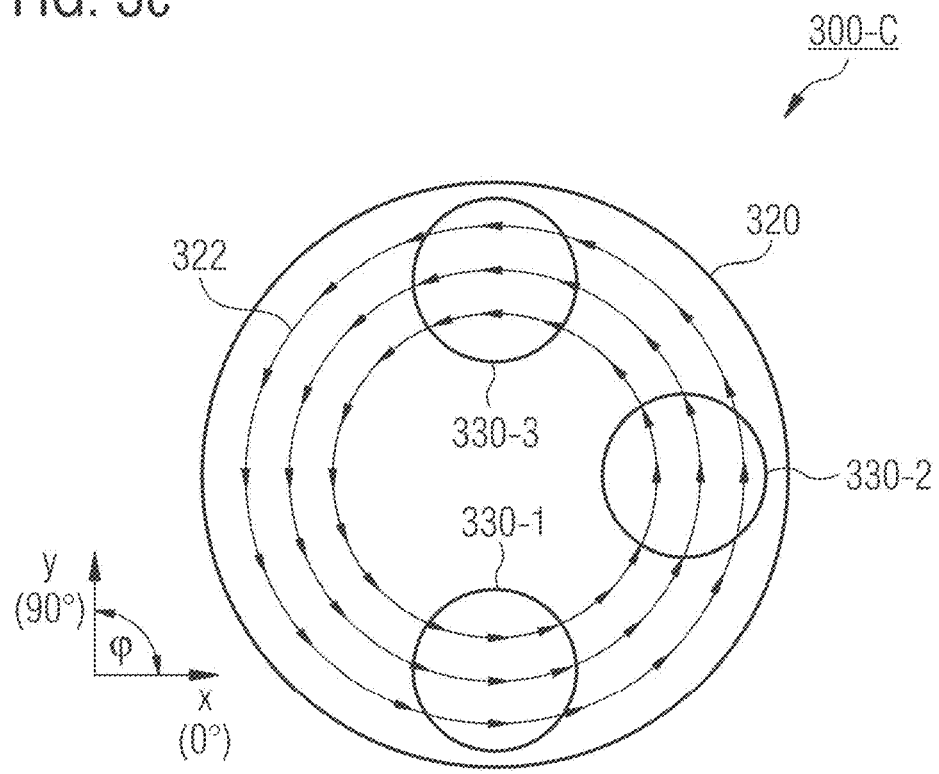

The magnetoresistive sensor 300-C shown in FIG. 3c is similar to that of FIG. 3b, however, the magnetic free layer comprises an additional third part 330-3 with a circular cross sectional area and laterally separated from both the first and the second part 330-1, 330-2. A third average direction of the closed flux magnetization pattern 322 vertically above (or vertically below) the third part 330-3 of the magnetic free layer points predominantly in negative x-direction (i.e., in $\varphi=180°$ direction).

Figure 3D:
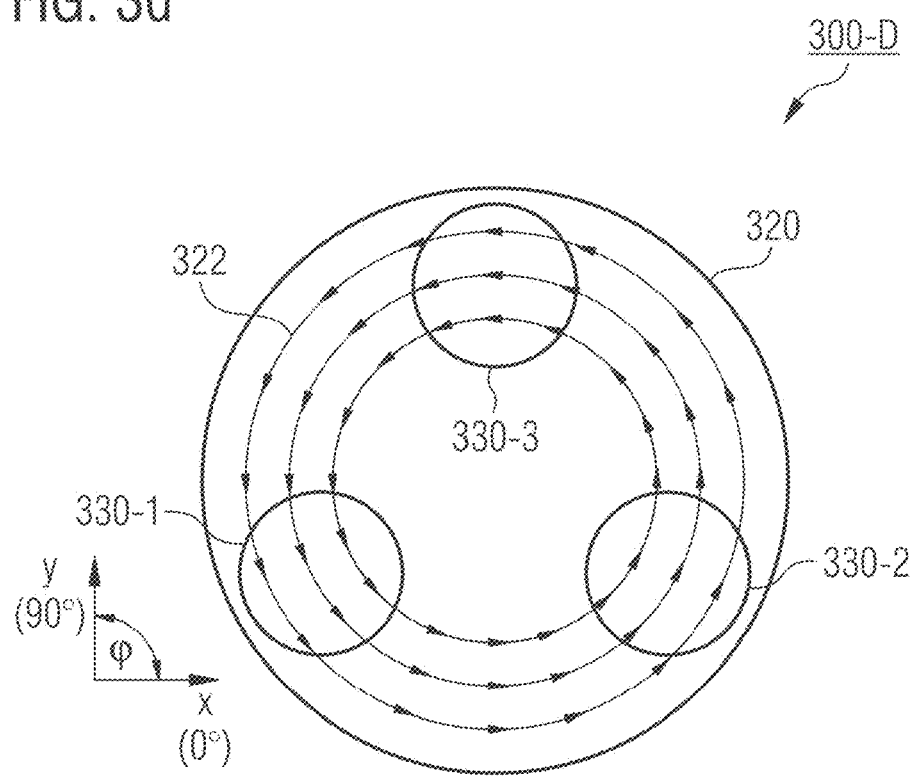

Of course, the parts of the magnetic free layer can be placed differently above (or below) the magnetic reference layer (and an optional pinned layer). The magnetoresistive sensor 300-D shown in FIG. 3d is similar to that of FIG. 3c, however, the first and the second part 330-1, 330-2 of the magnetic free layer are placed differently with respect to the magnetic reference layer 320. As a result, the first average direction of the closed flux magnetization pattern 322 points predominantly in φ=315° (or −45°) direction, while the second average direction of the closed flux magnetization pattern 322 points predominantly in φ=45° direction for the depicted arrangement. The arrangement of FIG. 3d can be regarded as an equilateral triangle with angles of 120° between the different parts 330-1, 330-2, and 330-3 forming the triangle's corners.

Figure 3E:
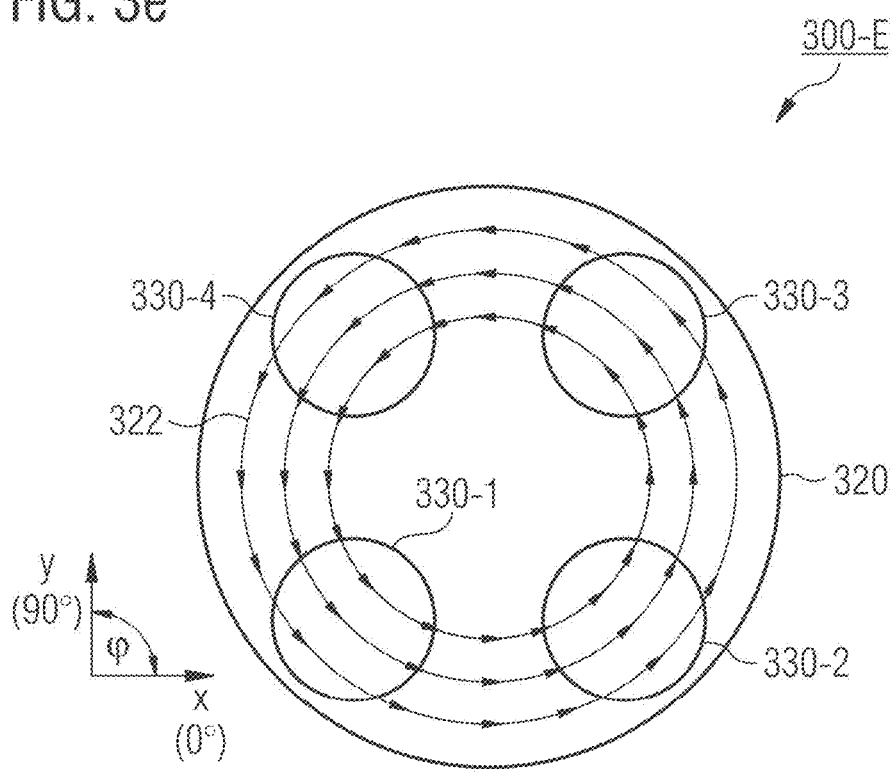

The magnetoresistive sensor 300-E shown in FIG. 3e is similar to that of FIG. 3d, however, the magnetic free layer comprises a fourth part 330-4 with a circular lateral cross sectional area. The fourth part 330-4 is laterally separated from the first, second and third part 330-1, 330-2, 330-3 of the magnetic free layer. Furthermore, the third average direction of the closed flux magnetization pattern 322 points predominantly in φ=135° direction, while a fourth average direction of the closed flux magnetization pattern 322 vertically above (or vertically below) the fourth part 330-4 of magnetic free layer points predominantly in φ=225° direction in the depicted arrangement. The respective φ's for 330-1 . . . 330-4 are 315°, 45°, 135°, and 225°.

Furthermore the magnetic free layer might not be circular in order to come up with a vortex magnetization as well. Linearly magnetizing magnetic free layers (or parts of it) may be used instead.

Figure 3F:
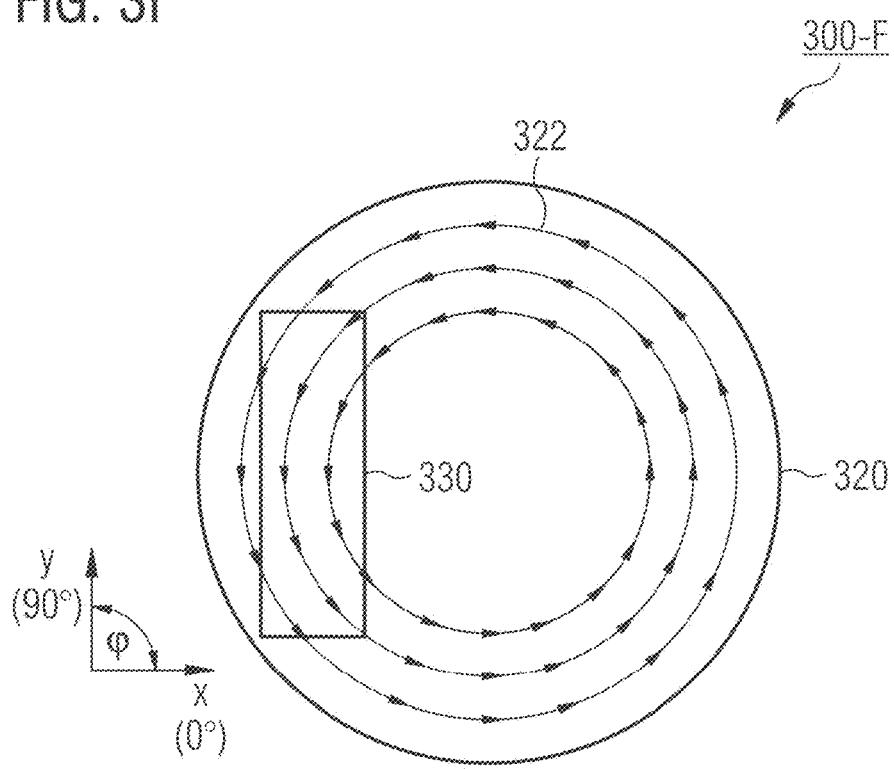

The magnetoresistive sensor 300-F shown in FIG. 3f is similar to that of FIG. 3a, however, the magnetic free layer 330 comprises a rectangular lateral cross sectional area and the average direction of the closed flux magnetization pattern 322 vertically above (or vertically below) the magnetic free layer 330 points predominantly in negative y-direction (i.e., in φ=270° direction).

Figure 3G:
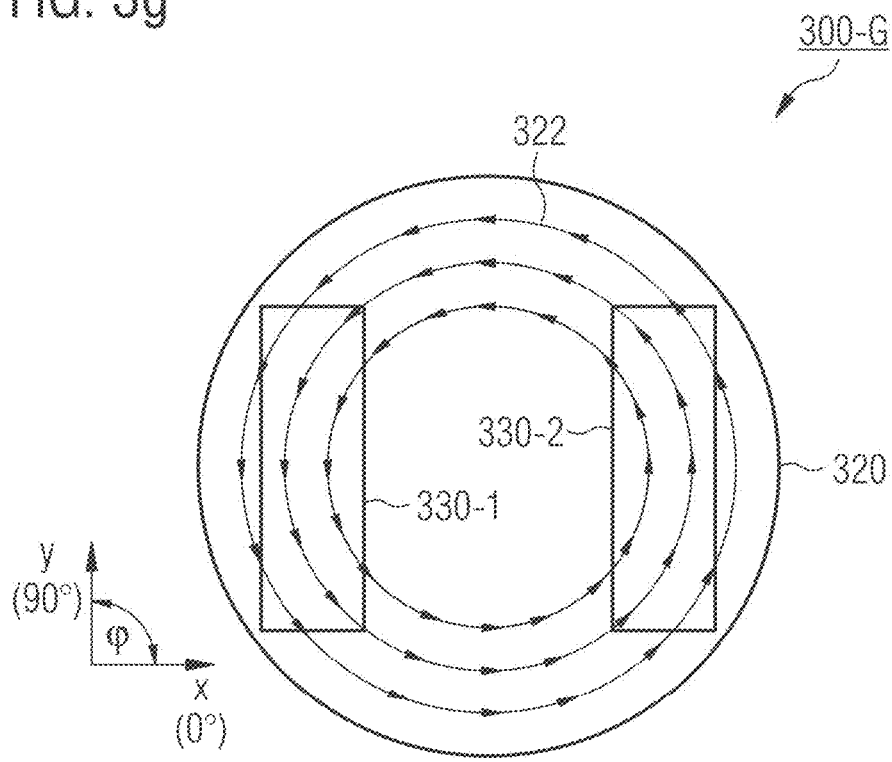

The magnetoresistive sensor 300-G shown in FIG. 3g is similar to that of FIG. 3f, but additionally comprises a second part 330-2 of the magnetic free layer with a rectangular lateral cross sectional area. An average direction of the closed flux magnetization pattern 322 vertically above (or vertically below) the second part 330-2 of the magnetic free layer points predominantly in y-direction.

Figure 3H:
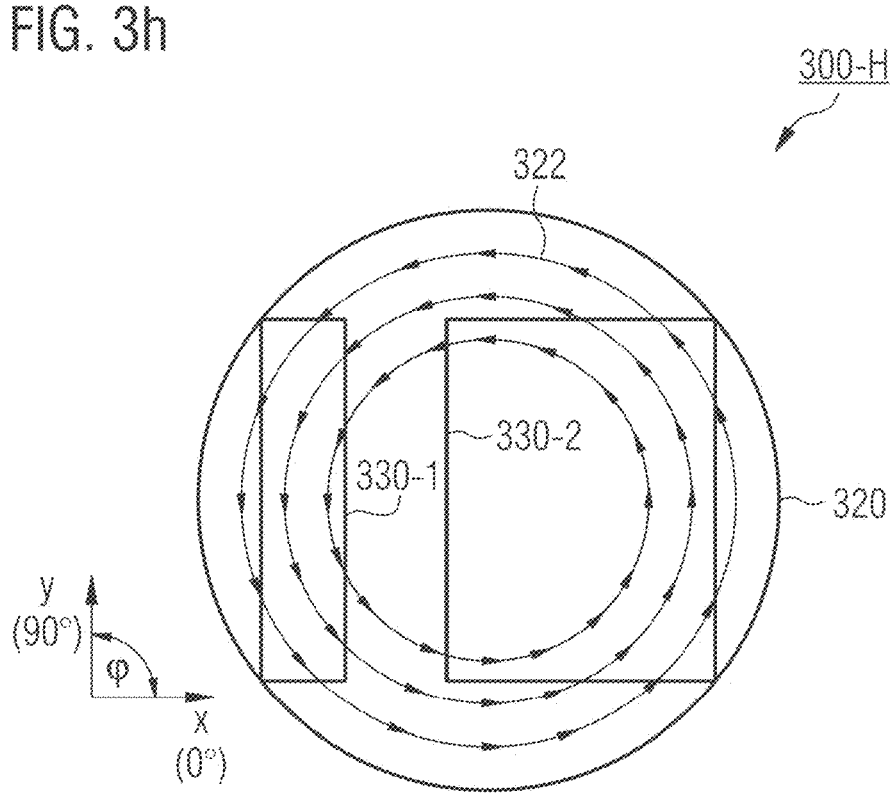

For the magnetoresistive sensor 300-H shown in FIG. 3h, which is similar to that of FIG. 3g, the rectangular lateral cross sectional area of the second part 330-2 of the magnetic free layer is larger than the lateral cross sectional area of the first part 330-1 of the magnetic free layer of the magnetoresistive sensor 300-G. This can increase the sensitivity of the magnetoresistive sensor 300-H with respect to the magnetoresistive sensor 300-G.

Figure 3I:
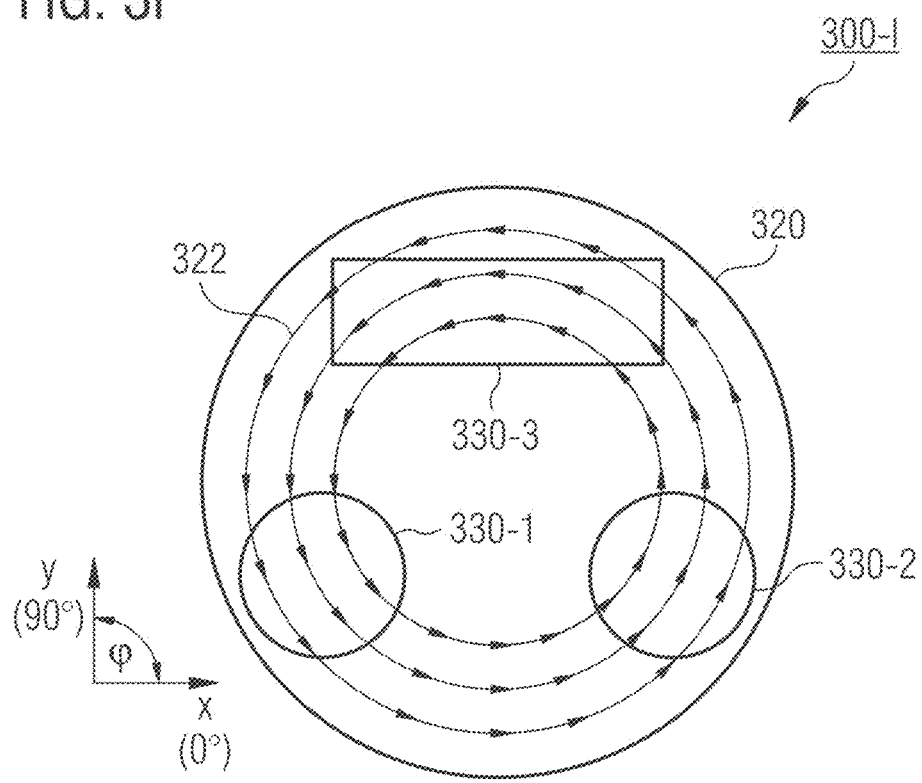

FIG. 3i shows a magnetoresistive sensor 300-I, whose magnetic free layer comprises a first part 330-1 and a second part 330-2 with circular lateral cross sectional areas and a third part with a rectangular lateral cross sectional area.

Figure 4A:
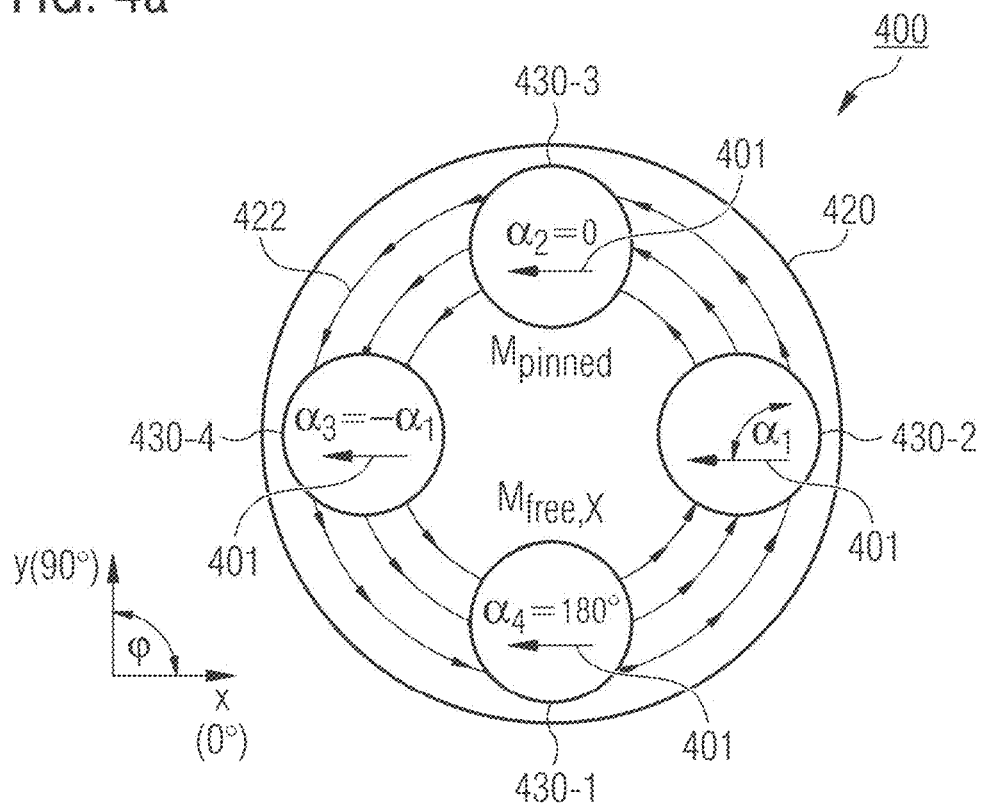
FIGS. 4a and 4b show a magnetoresistive sensor being subjected to an external magnetic field according to one or more embodiments.

FIG. 4a shows a magnetoresistive sensor 400 being subjected to an external magnetic field 401. The magnetoresistive sensor 400 is similar to that of FIG. 3c, but its magnetic free layer comprises an additional fourth part 430-4 with a fourth average direction of the closed flux magnetization pattern 422 of the reference layer vertically above (or vertically below) the fourth part 430-4 of the magnetic free layer pointing predominantly in negative y-direction. The external magnetic field 401 points in negative x-direction. This causes the magnetization of the first part 430-1 of the magnetic free layer to be aligned antiparallel to the first average direction of the closed flux magnetization pattern 422 of the magnetic reference layer 420.

In other words, the external magnetic field 401 causes the magnetization of the first part 430-1 of the magnetic free layer to be directed oppositely to a first reference magnetization of a first magnetoresistor (of the magnetoresistive sensor 400) comprising the first part 430-1 of the magnetic free layer. Accordingly, the external magnetic field 401 causes the magnetization of the second part 430-2 of the magnetic free layer to be directed perpendicularly to a second reference magnetization (given by the second average direction of the closed flux magnetization pattern 422) of a second magnetoresistor (of the magnetoresistive sensor 400) comprising the second part 430-2 of the magnetic free layer.

Moreover, the external magnetic field 401 causes the magnetization of the third part 430-3 of the magnetic free layer to be directed in parallel to a third reference magnetization (given by the third average direction of the closed flux magnetization pattern 422) of a third magnetoresistor (of the magnetoresistive sensor 400) comprising the third part 430-3 of the magnetic free layer. Furthermore, the external magnetic field 401 causes the magnetization of the fourth part 430-4 of the magnetic free layer to be directed perpendicularly to a fourth reference magnetization (given by the fourth average direction of the closed flux magnetization pattern 422) of a fourth magnetoresistor (of the magnetoresistive sensor 400) comprising the fourth part 430-4 of the magnetic free layer.

Figure 4B:
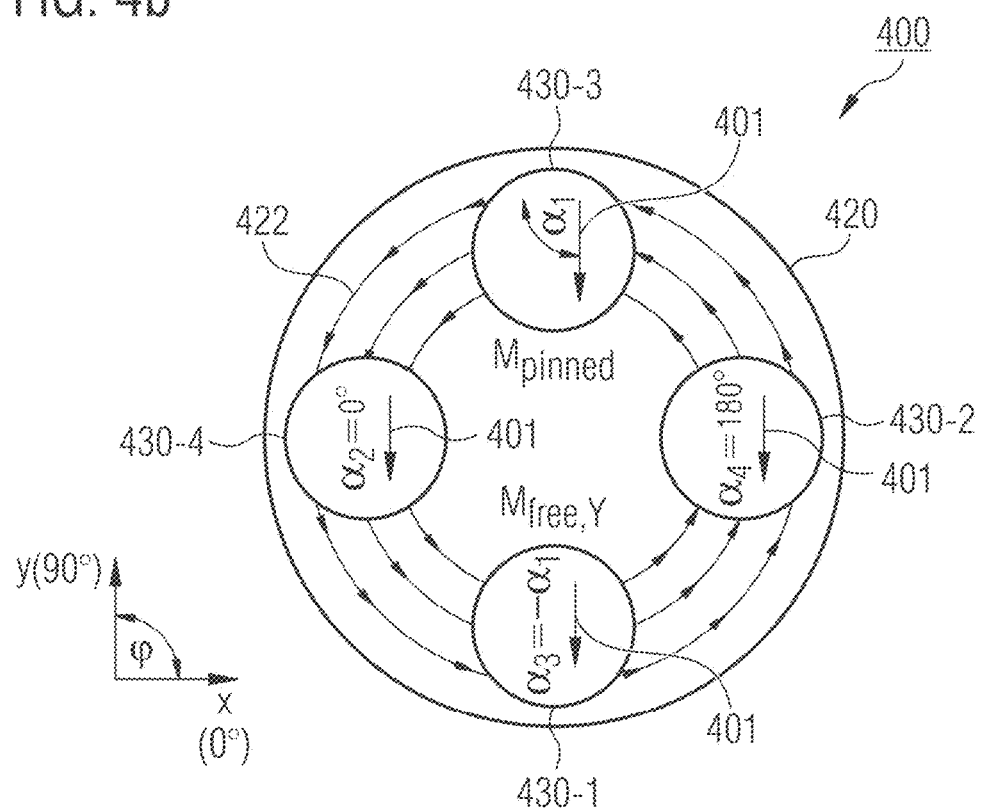

In FIG. 4b, the external magnetic field 401 is incident upon the magnetoresistive sensor 400, but directed in negative y-direction. This causes the magnetization of the first part 430-1 of the magnetic free layer to be perpendicular to the first reference magnetization of the first magnetoresistor, the magnetization of the second part 430-2 of the magnetic free layer to be opposite to the second reference magnetization of the second magnetoresistor, the magnetization of the third part 430-3 of the magnetic free layer to be perpendicular to the third reference magnetization of the third magnetoresistor, and the magnetization of the fourth part 430-4 of the magnetic free layer to be parallel to the fourth reference magnetization of the fourth magnetoresistor of the magnetoresistive sensor 400.

Figure 4C:
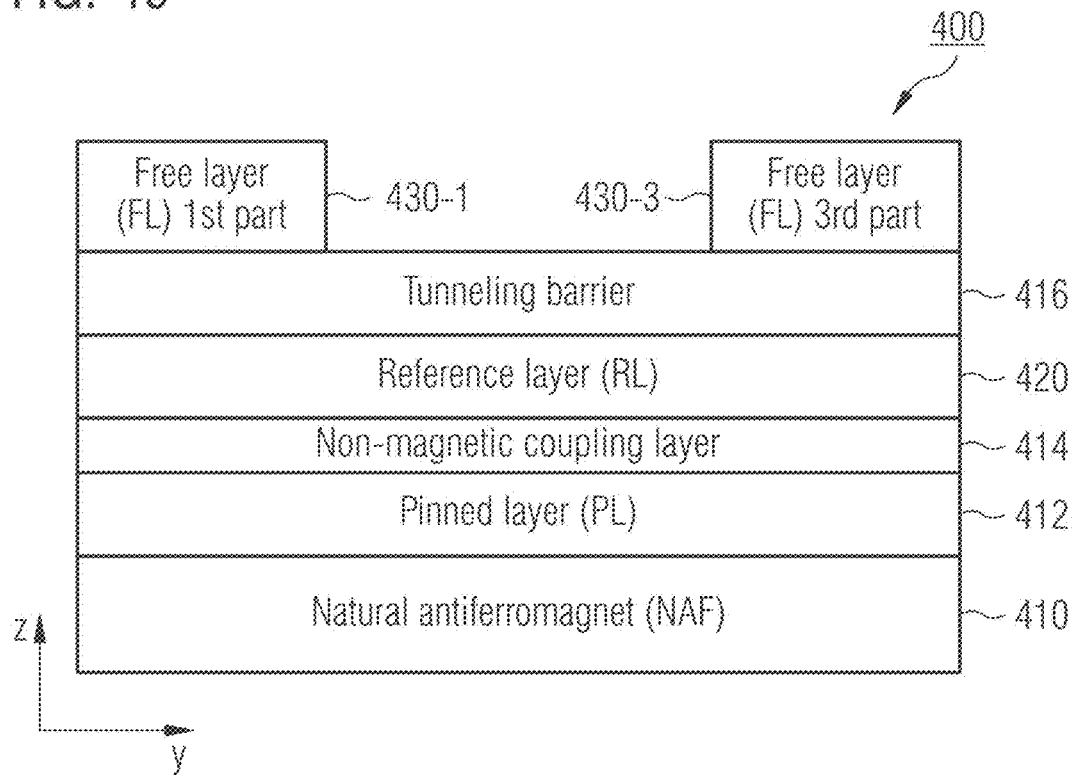
FIGS. 4c and 4d show schematic vertical cross sections of different possible build-ups of a magnetic layer stack of a magnetoresistive sensor according to one or more embodiments.
Figure 4D:
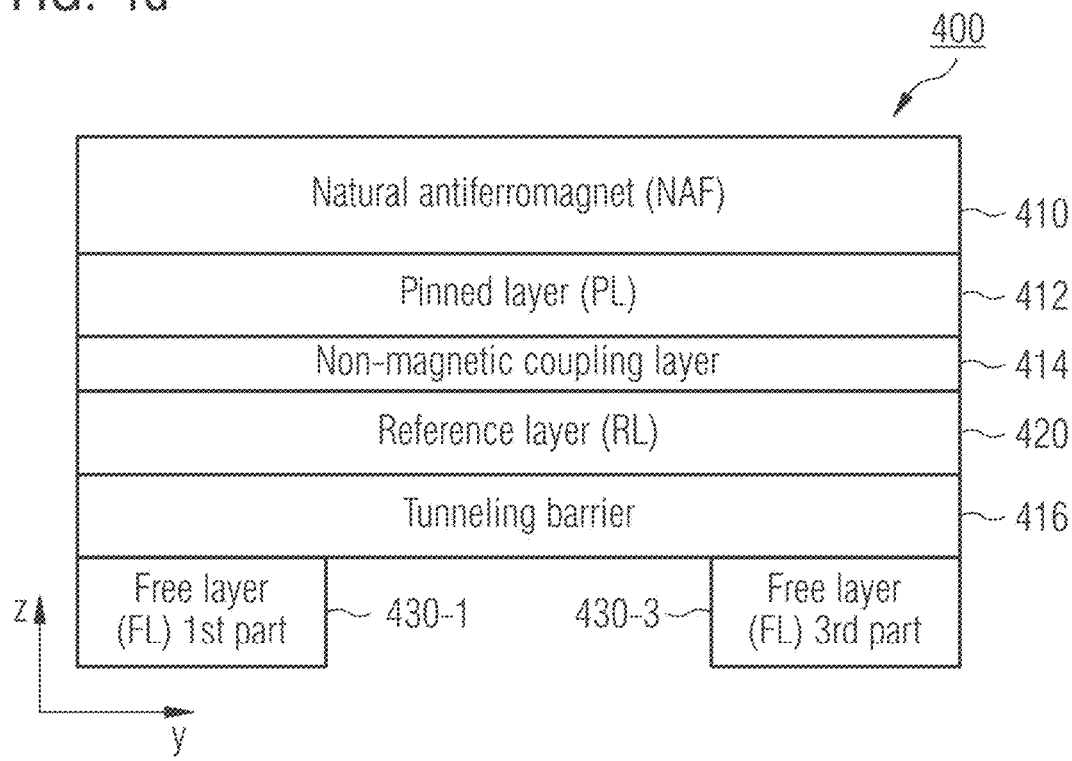

FIGS. 4c-4d show schematic vertical cross sections (in the yz-plane) of different possible build-ups of a magnetic layer stack of the magnetoresistive sensor 400 of FIGS. 4a-4b.

The vertical cross section in FIG. 4c shows a first possible stack implementation: The so-called "bottom-pinned spin-valve" structure (BSV), which comprises a natural antiferromagnetic (NAF) layer 410 on the bottom (e.g., substrate) side. Materials that can be used are, for example, platinum-manganese (PtMn), iridium-manganese (IrMn), and/or nickel-manganese (NiMn). A film thickness of the NAF can be in the range of 5 nm to 50 nm. On top of the NAF 410 the so-called "reference system" (e.g., magnetic reference system) is deposited, comprising a pinned layer (PL) 412 and the antiferromagnetically coupled (magnetic) reference layer (RL) 420. Both layers (e.g., the pinned layer 412 and the reference layer 420) can comprise ferromagnetic materials, such as cobalt-iron alloys (CoFe), cobalt-iron-boron (CoFeB) alloys, and/or nickel-iron (NiFe) alloys. A non-magnetic coupling layer 414 in-between (e.g. comprising ruthenium and/or copper) can provide an antiferromagnetic Ruderman-Kittel-Kasuya-Yosida (RKKY) coupling to form an artificial antiferromagnet. The film thickness for the pinned layer 412 and the reference layer 420, respectively, may be in the range of 1 nm to 100 nm. A spontaneous building of a vortex-like magnetization pattern (e.g., a closed flux magnetization pattern) can depend on the magnetic energy, given by the geometry (diameter and film thickness) and material (saturation magnetization). Next, the tunnelling barrier layer 416 can be deposited. Materials of the tunnel barrier layer 416 can be aluminium-oxide ($Al_2O_3$) and/or magnesium-oxide (MgO), for example. The thickness of the tunnel barrier layer 416 can be in the range of 0.5 nm to 5 nm. Last functional layer can be the (magnetic) free layer (FL) (shown are the first part 430-1 and the third part 430-3 of the magnetic free layer), acting as the sensor layer changing its magnetization upon an external magnetic in-plane field. Materials of the magnetic free layer can be similar to the alloys of ferromagnetic materials of the pinned layer 412 and the reference layer 420 PL/RL, like CoFe, CoFeB, and/or NiFe. The magnetic free layer may also comprise a multilayer-stack with ferromagnetic and non-magnetic material. In addition, also further layers not involved in the TMR effect may be introduced, e.g., seed layers to influence/optimize the stack growth or a low ohmic bottom electrode e.g. comprising copper. The whole stack may be deposited in one process and the magnetic free layer and the remaining stack part can be structured in separate etch processes, for example.

Since the magnetic free layer is deposited above the magnetic reference layer 420 in the exemplary magnetic layer stack of FIG. 4c, the closed flux magnetization pattern of the magnetic reference layer 420 can exist vertically below the respective parts of the magnetic free layer. However, the magnetic free layer might not be on the top of the stack. FIG. 4d shows a different build-up of the magnetic layer stack of the magnetoresistive sensor 400, wherein firstly the magnetic free layer is deposited (on a substrate) and structured before the remaining stack is deposited and structured. In this case the stack is called "top-pinned spin-valve", since the reference system is on top of the stack. The closed flux magnetization pattern of the magnetic reference layer 420 can then exist vertically above the respective parts of the magnetic free layer.

In addition to the magnetic free layer comprising a first and at least a second part laterally separated from the first part, the magnetic reference layer 220 (e.g., of the magnetoresistive sensors 200-A/B) can optionally comprise a first part and at least a second part (not shown in FIGS. 2a-2b). The first part of the magnetic reference layer 220 can be laterally separated from the second part of the magnetic reference layer 220. Furthermore, each part of the magnetic reference layer can comprise a respective permanent closed flux magnetization pattern of a predetermined rotational direction. Additionally, a vertical projection of the first part of the magnetic free layer onto the magnetic reference layer can be laterally surrounded by a perimeter of the first part of the magnetic reference layer 220. A vertical projection of the second part of the magnetic free layer 230 onto the magnetic reference layer 220 can be laterally surrounded by a perimeter of the second part of the magnetic reference layer 220.

In other words, the first part of the magnetic free layer 230 may be located vertically above (or, depending on the build-up of the magnetic layer stack, vertically below) the first part of the magnetic reference layer 220, while the second part of the magnetic free layer 230 can be located vertically above (or vertically below) the second part of the magnetic reference layer 220. A centroid of the first part of the magnetic free layer 230 may be laterally displaced with respect to a centroid of the first part of the magnetic reference layer 220. Likewise, a centroid of the second part of the magnetic free layer 230 may be laterally displaced with respect to a centroid of the second part of the magnetic reference layer 220. This way a plurality of magnetoresistors of the magnetoresistive sensor 200-A/B may be provided.

For example, this can enable providing two (or more) magnetoresistor having the same direction of reference magnetization, if the average direction of the closed flux magnetization pattern in the first part of the magnetic reference layer 220 vertically above (or vertically below) the first part of the magnetic free layer 230 is equal to the average direction of the closed flux magnetization pattern in the second part of the magnetic reference layer 220 vertically above (or vertically below) the second part of the magnetic free layer 230. Magnetoresistors having the same direction of reference magnetization may optionally be connected in series, which can increase the sensitivity of the magnetoresistive sensor 200-A/B and/or adjust the resistivity to a certain value.

Furthermore, in this way, magnetoresistors comprising separated parts of the magnetic reference layer 220 can be provided. This may be useful in GMR sensors for electrically insulating the first part of the magnetic free layer 230 from the second part the magnetic free layer 230. In a TMR sensor, the tunnel barrier layer may electrically insulate the first part of the magnetic free layer 230 from the second part the magnetic free layer 230.

Of course, also magnetoresistor having a different direction of reference magnetization can be provided in this way, if the average direction of the closed flux magnetization pattern in the first part of the magnetic reference layer 220 vertically above (or vertically below) the first part of the magnetic free layer 230 differs from the average direction of the closed flux magnetization pattern in the second part of the magnetic reference layer 220 vertically above (or vertically below) the second part of the magnetic free layer 230. Magnetoresistors having a differing direction of reference magnetization can be employed for detecting or measuring different directional components of an external magnetic field applied to the magnetoresistive sensor 200-A/B, for example.

According to some examples, a magnetoresistive sensor 200-A/B, whose magnetic free layer 230 comprises a first part and at least a second part, can comprise a bridge circuit. The bridge circuit can comprise a first and at least a second magnetoresistor. The first magnetoresistor can comprise the first part of the magnetic free layer 230, while the second magnetoresistor can comprise the second part of the magnetic free layer 230.

For example, within the bridge circuit, the first and the second part of the magnetic free layer 230 may be located vertically above (or vertically below) the same part of the magnetic reference layer 220. Alternatively, the first and the second part of the magnetic free layer 230 may be located vertically above (or vertically below) separated parts of the magnetic reference layer 220.

The magnetic reference layer 220 may be used as a common node of the first and the second magnetoresistor of the bridge circuit. For example, this common node can be a bridge bias input node (e.g., connected to a supply voltage or ground potential of the bridge circuit). Alternatively, this common node can be a bridge output node that provides an electric potential (or voltage) indicative for the strength of a directional component of an externally imposed magnetic field. Alternatively, this common node can be an interconnection of the first and the second magnetoresistor if the first and the second magnetoresistor are connected in series, for example.

The bridge circuit may comprise a first, second, third, and fourth bridge resistor. The first bridge resistor may be connected between a first bridge bias input node (e.g., connected to a supply voltage) and a first bridge output node. The second bridge resistor may be connected between the first bridge bias input node and a second bridge output node. The third bridge resistor may be connected between the first bridge output node and a second bridge bias input node (e.g., connected to ground potential or to a different supply voltage). The fourth bridge resistor may be connected between the second bridge output node and the second bridge bias input node. A voltage (e.g., a bridge voltage) between the first and the second bridge output node can be indicative for the strength of a directional component of an externally imposed magnetic field. At least one of the first, second, third, and fourth bridge resistor may comprise a series connection of magnetoresistors as described above, which can increase the sensitivity of the bridge circuit and hence of the magnetoresistive sensor 200-A/B.

Figure 5A:
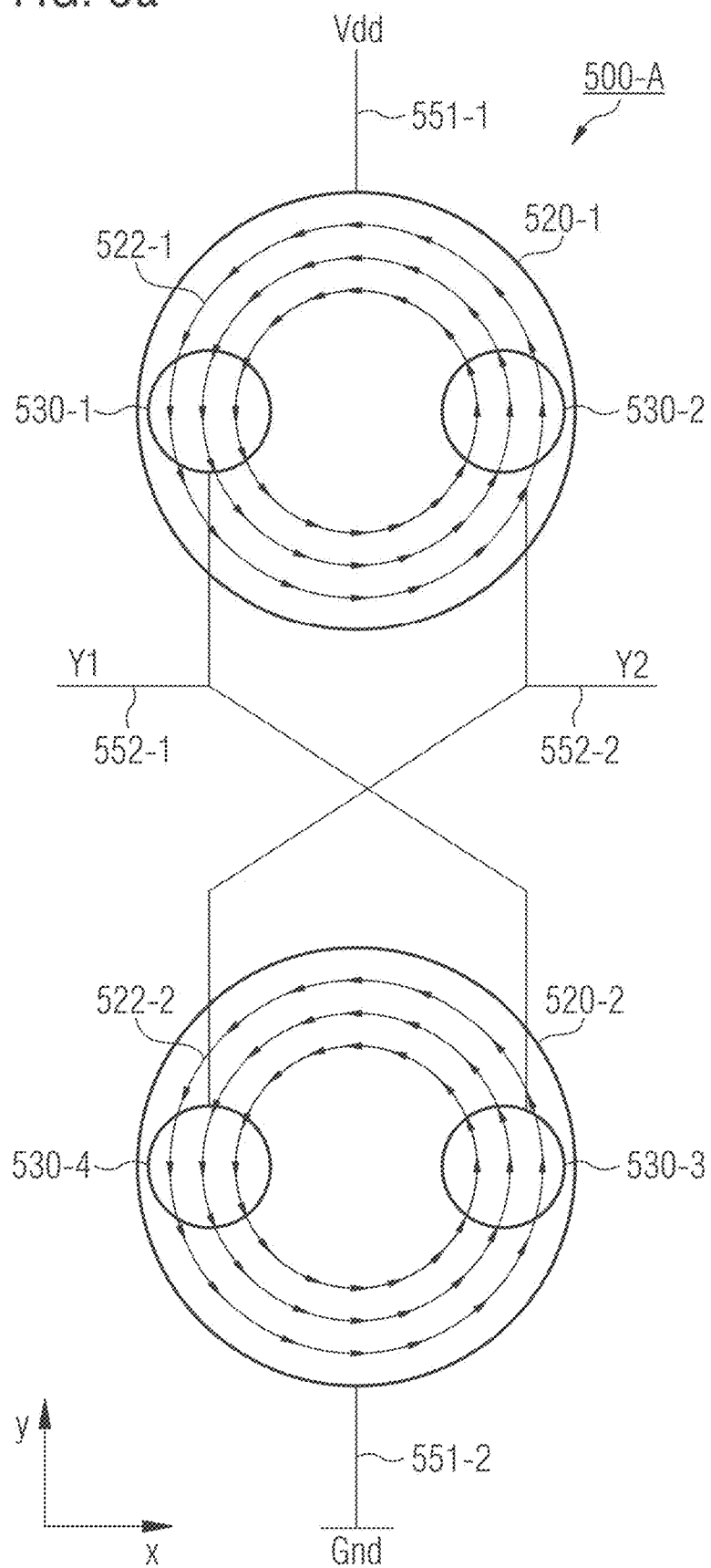
FIGS. 5a-5d show schematic diagrams of bridge circuits of magnetoresistive sensors comprising two or more laterally separated parts of a magnetic reference layer with a closed flux magnetization pattern in each part according to one or more embodiments.

FIG. 5a shows a bridge circuit 500-A of a magnetoresistive sensor according to an example of the present disclosure. The bridge circuit 500-A comprises a first part 520-1 and a second part 520-2 of a magnetic reference layer of the magnetoresistive sensor. The first part 520-1 of the magnetic reference layer comprises a first permanent closed flux magnetization pattern 522-1 of a predetermined rotational direction (e.g., counterclockwise). The second part 520-2 of the magnetic reference layer comprises a second permanent closed flux magnetization pattern 522-2 of a predetermined rotational direction (e.g., counterclockwise). Furthermore, the bridge circuit 500-A comprises a first part 530-1, a second part 530-2, a third part 530-3, and a fourth part 530-4 of a magnetic free layer of the magnetoresistive sensor. The first and the second part 530-1, 530-2 of the magnetic free layer are located vertically above (or vertically below) the first part 520-1 of the magnetic reference layer. The third and the fourth part 530-3, 530-4 of the magnetic free layer are located vertically above (or vertically below) the second part 520-2 of the magnetic reference layer.

A first average direction of the first closed flux magnetization pattern 522-1 is directed in opposite y-direction vertically above (or vertically below) the first part 530-1 of the magnetic free layer. A second average direction of the first closed flux magnetization pattern 522-1 is directed in y-direction vertically above (or vertically below) the second part 530-2 of the magnetic free layer. A first bridge resistor of the bridge circuit 500-A comprises the first part 530-1 of the magnetic free layer. A second bridge resistor of the bridge circuit 500-A comprises the second part 530-2 of the magnetic free layer. Furthermore, the first and the second bridge resistor share the first part 520-1 of the magnetic reference layer. The first part 520-1 of the magnetic reference layer is connected to a first bridge bias input node 551-1 of the bridge circuit 500-A. The first bridge bias input node 551-1 is connected to a supply voltage $V_{dd}$ of the bridge circuit 500-A. The first part 530-1 of the magnetic free layer is connected to a first bridge output node 552-1 of the bridge circuit 500-A. The second part 530-2 of the magnetic free layer is connected to a second bridge output node 552-2 of the bridge circuit 500-A. Hence, the first bridge resistor is connected between the first bridge bias input node 551-1 and the first bridge output node 552-1, while the second bridge resistor is connected between the first bridge bias input node 551-1 and the second bridge output node 552-2.

A first average direction of the second closed flux magnetization pattern 522-2 is directed in y-direction vertically above (or vertically below) the third part 530-3 of the magnetic free layer. A second average direction of the second closed flux magnetization pattern 522-2 is directed in opposite y-direction vertically above (or vertically below) the fourth part 530-4 of the magnetic free layer. A third bridge resistor of the bridge circuit 500-A comprises the third part 530-3 of the magnetic free layer. A fourth bridge resistor of the bridge circuit 500-A comprises the fourth part 530-4 of the magnetic free layer. Furthermore, the third and the fourth bridge resistor share the second part 520-2 of the magnetic reference layer. The second part 520-2 of the magnetic reference layer is connected to a second bridge bias input node 551-2 of the bridge circuit 500-A. The second bridge bias input node 551-2 is connected to ground Gnd of the bridge circuit 500-A, but could alternatively also be connected to another supply voltage different from $V_{dd}$. The third part 530-3 of the magnetic free layer is connected to the first bridge output node 552-1. The fourth part 530-4 of the magnetic free layer is connected to the second bridge output node 552-2. Hence, the third bridge resistor is connected between the first bridge output node 552-1 and the second bridge bias input node 551-2, while the fourth bridge resistor is connected between the second bridge output node 552-2 and the second bridge bias input node 551-2.

When no external magnetic field or an external magnetic field that does neither have any component in y-direction nor in opposite y-direction is applied to the bridge circuit 500-A, a voltage (e.g., a bridge voltage) between the first bridge output node 552-1 and the second bridge output node 552-2 can be equal to zero, for example. Supposing an external magnetic field with a component in (positive) y-direction is applied, a resistance of the first bridge resistor may increase because the first part 530-1 of the magnetic free layer may at least be partially magnetized in y-direction and hence opposite to the first average direction of the first closed flux magnetization pattern 522-1. On the other hand, a resistance of the third bridge resistor may decrease because the third part 530-3 of the magnetic free layer may at least be partially magnetized in y-direction, which is also the direction of the first average direction of the second closed flux magnetization pattern 522-2. For a positive supply voltage $V_{dd}$, an electric potential of the first bridge output node 552-1 may then decrease. Due to similar reasons, a resistance of the second bridge resistor may decrease, while a resistance of the fourth bridge resistor may increase. This causes an electric potential of the second bridge output node 552-2 to increase. The electric potential of the second bridge output node 552-2 may hence increase and be larger than the electric potential of the first bridge output node 552-1, or, in other words, the bridge voltage from the first bridge output node 552-1 to the second bridge output node 552-2 may be negative. Accordingly, an externally imposed magnetic field with a component in negative y-direction can cause a positive bridge voltage. The sign of the bridge voltage can hence be indicative for the sense (e.g., positive or negative y-direction) of a y-component of the externally imposed magnetic field. Furthermore, the magnitude of the bridge voltage can be indicative for the strength of the y-component of the externally imposed magnetic field.

Figure 5B:
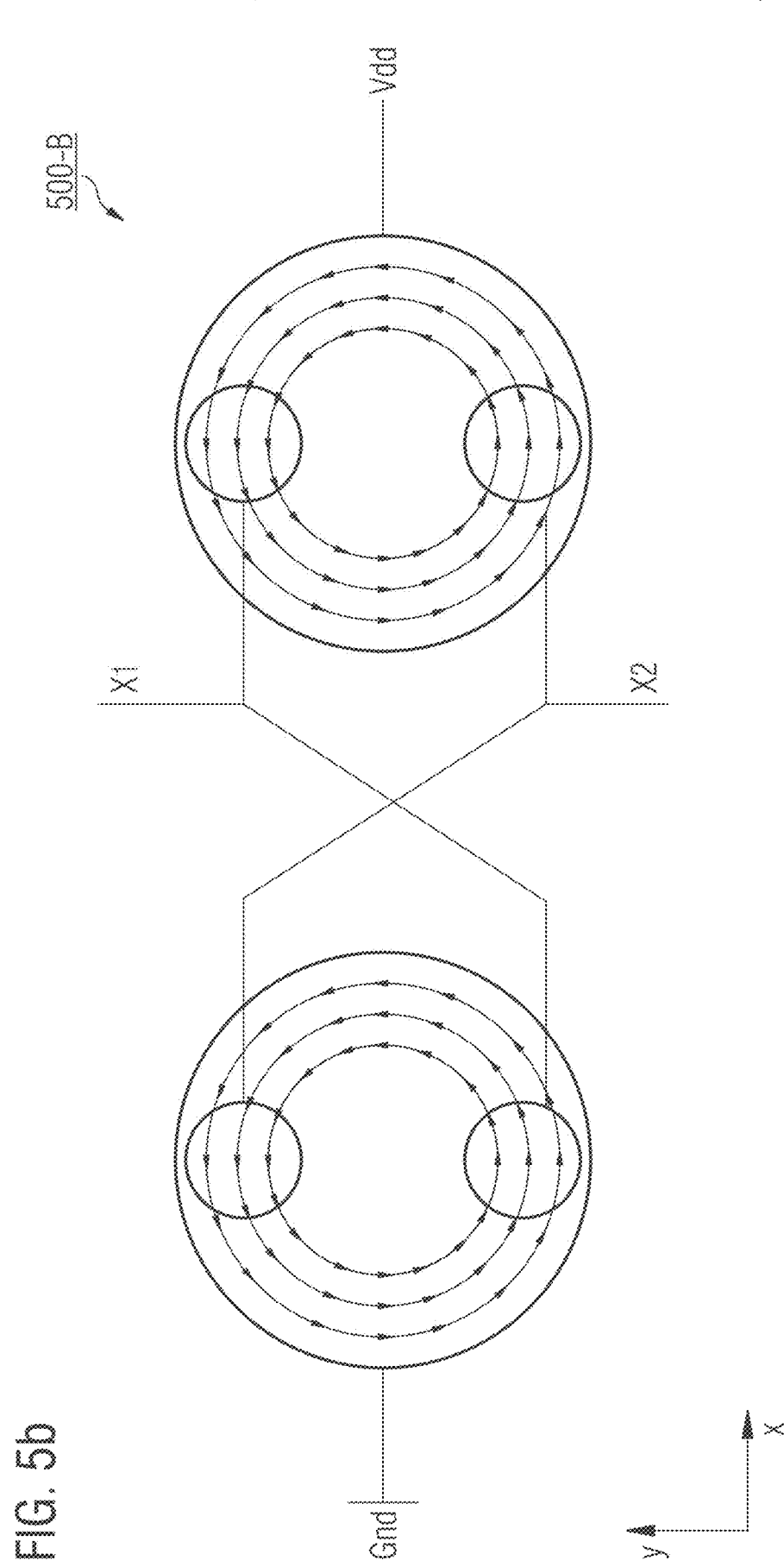

FIG. 5b shows a bridge circuit 500-B similar to the bridge circuit 500-A of FIG. 5a. The bridge circuit 500-B can be obtained by rotating the bridge circuit 500-A of FIG. 5a by 90° in clockwise direction. The bridge circuit 500-B may hence be used for measuring an x-component of an externally imposed magnetic field. An exemplary magnetoresistive sensor according to this disclosure may comprise both the bridge circuit 500-A and the bridge circuit 500-B, which can enable the magnetoresistive sensor to measure both the magnitude and the direction of an externally imposed magnetic field.

Figure 5C:
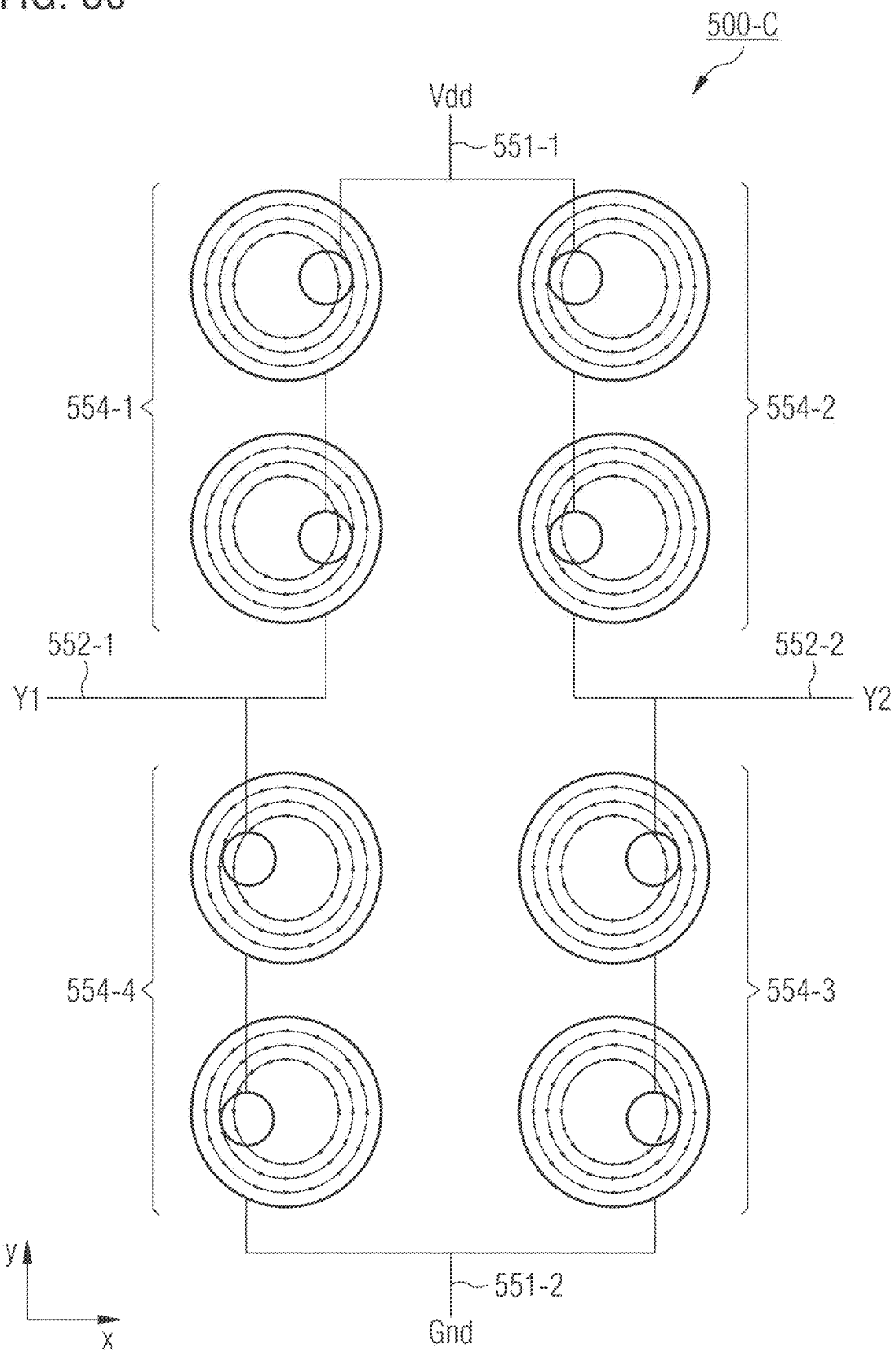

FIG. 5c shows another bridge circuit 500-C of a magnetoresistive sensor. The bridge circuit 500-C may be similar to the bridge circuit 500-A of FIG. 5a and may be employed for measuring a y-component of an externally imposed magnetic field. In contrast to the bridge circuit 500-A of FIG. 5a, each bridge resistor 554-1, 554-2, 554-3, 554-4 of the bridge circuit 500-C comprises two laterally separated parts of a magnetic reference layer of the magnetoresistive sensor. A respective part of a magnetic free layer of the magnetoresistive sensor is located vertically above (or vertically below) each part of the magnetic reference layer. Each bridge resistor 554-1, 554-2, 554-3, 554-4 hence comprises two serially connected magnetoresistors. This can increase the sensitivity of the bridge circuit 500-C with respect to the bridge circuit 500-A of FIG. 5a and/or increase the resistivity of the bridge circuit.

Figure 5D:
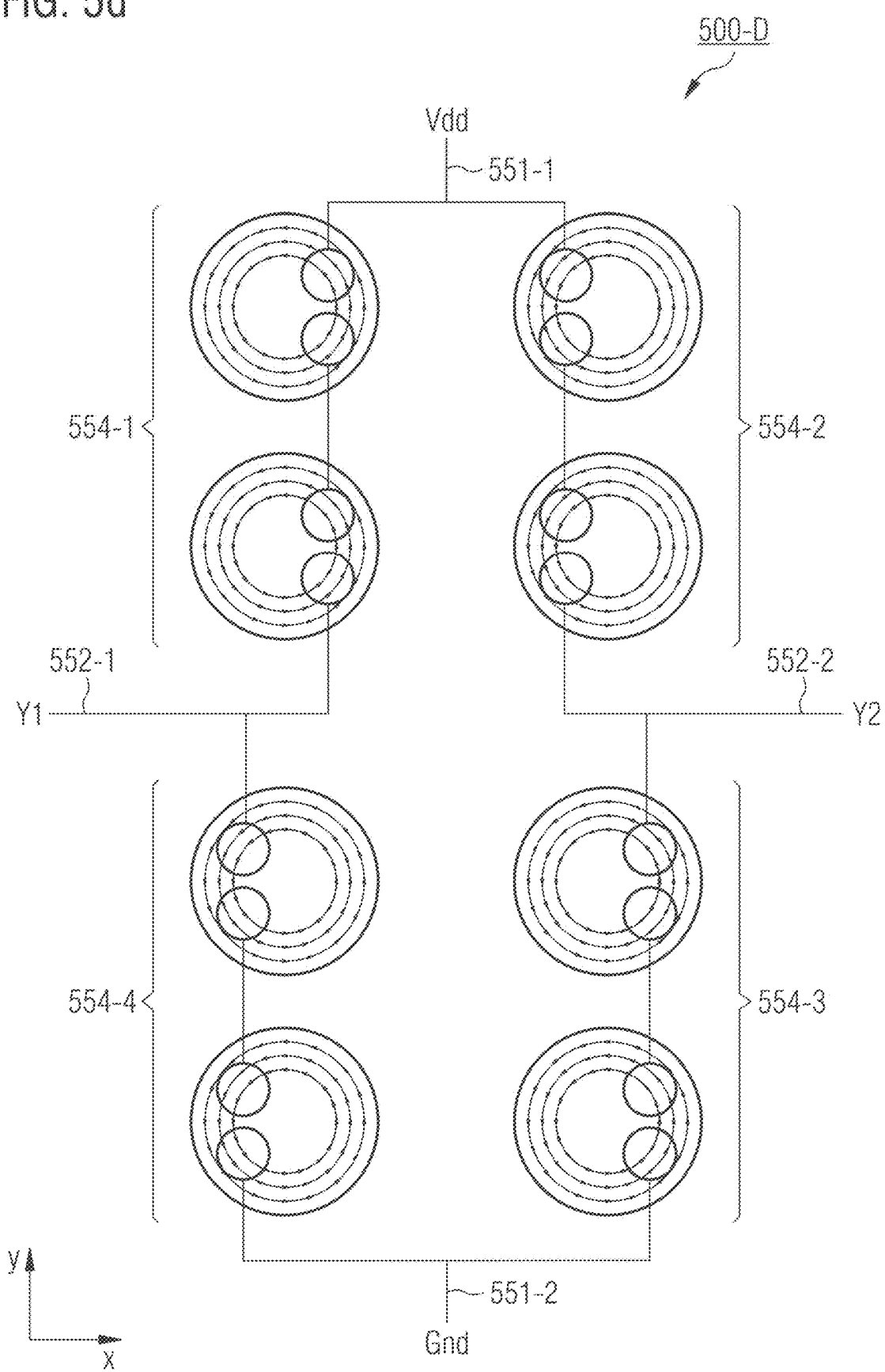

FIG. 5d shows yet another bridge circuit 500-D of a magnetoresistive sensor. The bridge circuit 500-D may be similar to the bridge circuit 500-C of FIG. 5c and may be employed for measuring a y-component of an externally imposed magnetic field. Each bridge resistor 554-1, 554-2, 554-3, 554-4 of the bridge circuit 500-D comprises also two laterally separated parts of a magnetic reference layer of the magnetoresistive sensor, but, in contrast to the bridge circuit 500-C of FIG. 5c, with two laterally separated parts of a magnetic free layer of the magnetoresistive sensor located vertically above (or vertically below) each part of the magnetic reference layer. Each bridge resistor 554-1, 554-2, 554-3, 554-4 of the bridge circuit 500-D hence comprises four serially connected magnetoresistors. This can even further increase the sensitivity and/or increase the resistivity of the bridge circuit 500-D with respect to the bridge circuits 500-A, 500-C of FIGS. 5a, 5c.

Figure 6A:
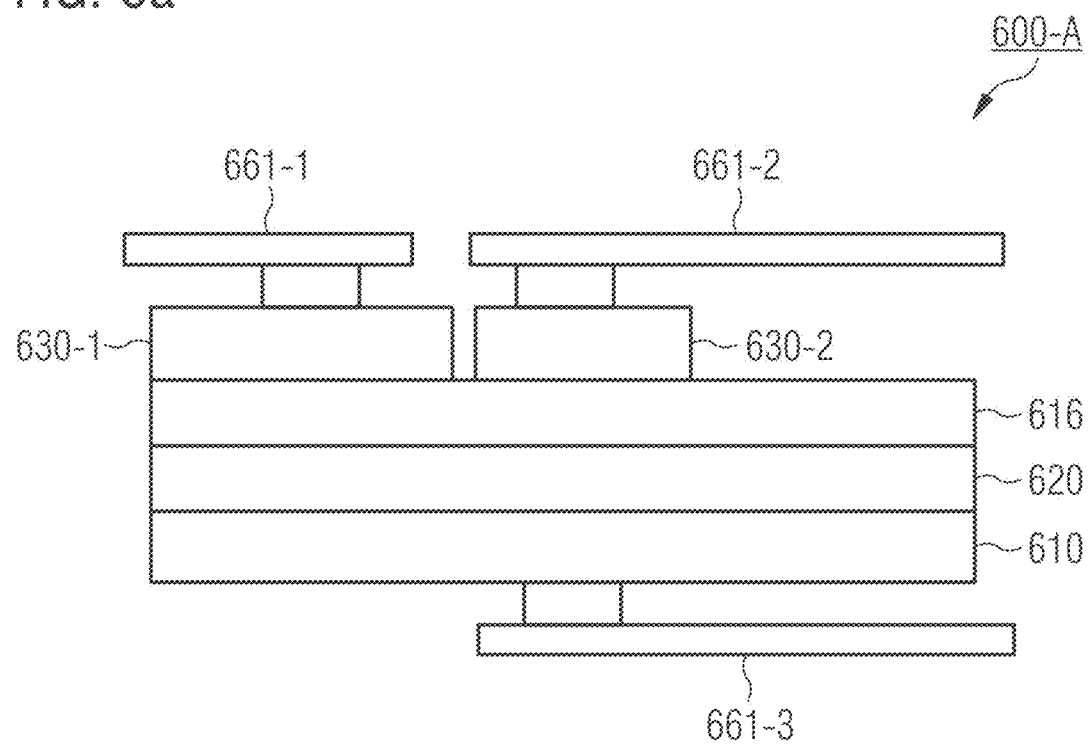
FIGS. 6a and 6b show schematic vertical cross sections of different possible build-ups of magnetic layer stacks with a vertical current path according to one or more embodiments.

In order to generate or to further support the formation of a permanent closed flux magnetization pattern (e.g., a vortex magnetization pattern) of a predetermined rotational direction in the magnetic reference layer of a magnetoresistive sensor, a vertical current path may be provided from the magnetic free layer (or a part of the magnetic free layer) to the magnetic reference layer. FIG. 6a shows a schematic vertical cross section of a magnetoresistive sensor 600-A with such a current path. The magnetoresistive sensor 600-A comprises a magnetic free layer with a first part 630-1 and a second part 630-2 that is laterally separated from the first part 630-1. A first electrode 661-1 of magnetoresistive sensor 600-A comprises a lateral wiring element (e.g., a conductor line) and a vertical wiring element (e.g., a via) and contacts the first part 630-1 of the magnetic free layer. A centroid of the first part 630-1 of the magnetic free layer is laterally displaced with respect to a centroid of a magnetic reference layer 620 of the magnetoresistive sensor 600-A. A magnetoresistor of the magnetoresistive sensor 600-A may comprise the first part 630-1 of the magnetic free layer together with a tunnel barrier layer 616, the magnetic reference layer 620 and a NAF layer 610 of the magnetoresistive sensor 600-A (and an optional magnetic pinned layer and an optional coupling layer, not shown in FIG. 6a). A second electrode 661-2 of the magnetoresistive sensor 600-A comprises another lateral wiring element (e.g., another conductor line) and another vertical wiring element (e.g., another via) and contacts the second part 630-2 of the magnetic free layer. A third electrode 661-3 of the magnetoresistive sensor 600-A comprises yet another lateral wiring element (e.g., another conductor line) and yet another vertical wiring element (e.g., another via) and contacts the NAF layer 610. During generation of the permanent closed flux magnetization pattern in the magnetic reference layer 620, an electric current can be applied to the magnetoresistive sensor 600-A and may flow between the second electrode 661-2 and the third electrode 661-3. A direction of the current (e.g., from the second to the third electrode or vice versa) can set the rotational direction of a magnetic field that encircles the current path and is in plane with the magnetic reference layer 620. The rotational direction of this magnetic field may then set (e.g., predetermine) the rotational direction of the permanent closed flux magnetization pattern in the magnetic reference layer 620. Optionally, the current path is located in the center of the structure (e.g., the magnetic layer stack) of the magnetoresistive sensor 600-A in order to further support the predetermination of the rotational direction by the circular field that is generated by the current through the center of the structure.

At least some exemplary magnetoresistive sensors of the present disclosure can comprise a tunnel barrier layer and an electrically conductive via. The tunnel barrier layer can be disposed between the magnetic reference layer and the magnetic free layer. The electrically conductive via can connect a part (e.g., the second part or alternatively another part, e.g., a third, fourth, or n-th part) of the magnetic free layer with the magnetic reference layer through the tunnel barrier layer. The part of the magnetic free layer can be laterally surrounded by electrically insulating material.

Figure 6B:
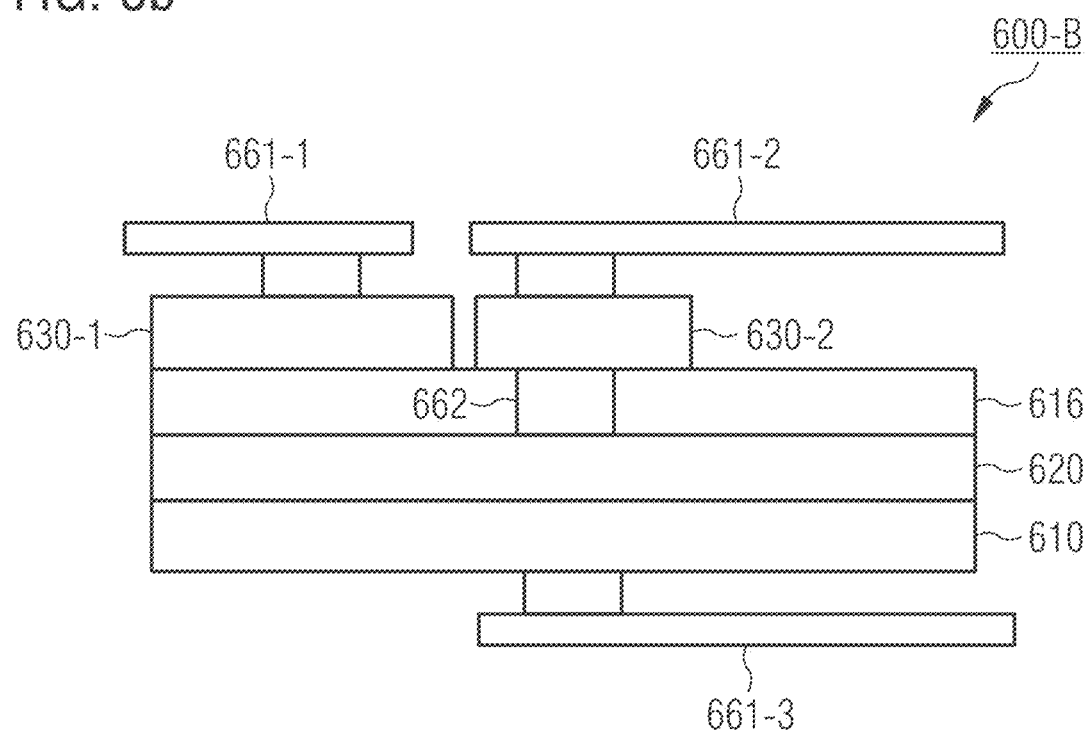

This is shown for the magnetoresistive sensor 600-B in FIG. 6b. The magnetoresistive sensor 600-B is similar to the magnetoresistive sensor 600-A of FIG. 6a. Due to the electrically conductive via 662 of the magnetoresistive sensor 600-B however, the current flowing between the second electrode 661-2 and the third electrode 661-3 for predetermining the rotational direction of the closed flux magnetization pattern during its generation can increase. Hence, also the strength of the magnetic field encircling the current can increase. This can make the predetermination of the rotational direction of the closed flux magnetization pattern more reliable. In other words, the current path can comprise a via through the tunnel oxide in order to reach a lower resistance for this path compared to the TMR structures (e.g., the magnetoresistive sensor 600-A).

Optionally, the electrically conductive via 662 can be located vertically above the centroid of the magnetic reference layer 620. This can further make the predetermination of the rotational direction of the closed flux magnetization pattern more reliable.

FIG. 7 shows a flow chart of a method 700 for generating a permanent closed flux magnetization pattern of a predetermined rotational direction in a magnetic reference layer of a magnetic layer stack. The method 700 comprises applying 710 an external magnetic field in a predetermined direction to the magnetic layer stack causing magnetic saturation of the magnetic reference layer and of a pinned layer of the magnetic layer stack. Furthermore, the method 700 comprises reducing 720 the external magnetic field to form a first closed flux magnetization pattern in the magnetic reference layer and a second closed flux magnetization pattern in the pinned layer.

By generating a permanent closed flux magnetization pattern of a predetermined rotational direction in the magnetic reference layer, local magnetization processes for providing desired directions of reference magnetization of magnetoresistors can be avoided. This can reduce manufacturing efforts of magnetoresistors and/or of magnetoresistive sensors and can hence reduce their manufacturing costs.

The external magnetic field can, for example, be unidirectional and/or homogeneous at the magnetic layer stack. By first causing magnetic saturation of the magnetic reference layer and of the pinned and by thereafter reducing 720 the external magnetic field, closed flux magnetization patterns can form in the magnetic reference layer and in the pinned layer. For example, a strength of the external magnetic field may be first set above an annihilation field strength of the magnetic reference layer and of the pinned layer which can cause magnetic saturation. During magnetic saturation, the magnetization of the magnetic reference layer and of the pinned layer may be unidirectional. Afterwards, the strength of the external magnetic field may be reduced below a nucleation field strength of the magnetic reference layer and of the pinned layer. Since the direction of the external magnetic field is predetermined (e.g., set in a specific lateral direction and in-plane with the magnetic reference layer and the pinned layer), the first and the second closed flux magnetization patterns can have a predetermined rotational direction. The first and the second closed flux magnetization pattern can have opposite rotational directions, for example. This way, the rotational direction of the first closed flux magnetization pattern may be permanently held in the same sense (e.g., clockwise or counterclockwise) by the second closed flux magnetization pattern in the pinned layer.

Additionally, the method 700 may further comprise structuring, prior to applying the external magnetic field, at least the magnetic reference layer to have a lateral cross section that comprises a main portion and a protrusion portion laterally adjacent to the main portion. After structuring, the external magnetic field can be applied 710 in parallel to the protrusion portion (e.g., along an axis of maximal lateral extension of the protrusion portion). For example, according to the method 700 the lateral cross section of the magnetic reference layer may be structured as illustrated in the context of FIGS. 2d-2i.

Additionally, the method 700 can further comprise pinning the second closed flux magnetization pattern in the pinned layer to a natural antiferromagnetic layer of the magnetic layer stack. This way, the second closed flux magnetization pattern may be kept permanently in the same rotational direction. Hence, also the first closed flux magnetization pattern may be kept permanently in its rotational direction (e.g., opposite to the rotational direction of the second closed flux magnetization pattern).

For example, the method 700 can comprise keeping a temperature of the magnetic layer stack below 200° C. during applying 710 the external magnetic field. After reducing 720 the external magnetic field, the method 700 can furthermore comprise increasing the temperature of the magnetic layer stack to above 240° C. but not exceeding a blocking temperature of the natural antiferromagnetic layer and the pinned layer. Furthermore, the method 700 can comprise keeping the temperature of the magnetic layer stack above 240° C. for more than one hour to form an antiferromagnetic phase within the natural antiferromagnetic layer causing an exchange bias coupling between the natural antiferromagnetic layer and the pinned layer. In this manner, the second closed flux magnetization pattern can be pinned to the natural antiferromagnetic layer of the magnetic layer stack. The blocking temperature of the natural antiferromagnetic layer and the pinned layer may at least be partially determined by the material combination of the natural antiferromagnetic layer and the pinned layer. The blocking temperature may be defined as the temperature above which the pinned layer is not (or no longer) magnetically coupled to the natural antiferromagnetic layer.

In other words, this can provide a possible procedure for the formation of a vortex-like magnetization in a magnetic reference system having a blocking temperature ranging from about 260° C. to about 400° C. For example, for platinum-manganese (PtMn) as the natural antiferromagnetic (NAF) material, an antiferromagnetic phase giving rise to an exchange bias effect to pin the pinned layer might not be present directly after the magnetic layer stack deposition. Applying 710 the external magnetic field until saturation of the device (e.g., the magnetic layer stack) can be carried out without additional temperature (e.g. at room temperature). An average magnitude of a magnetic flux density of the external magnetic field at the magnetic layer stack may be larger than 200 mT (or larger than 500 mT). The external magnetic field may then be reduced 720 (e.g., switched off). A vortex-like magnetization (e.g., the second closed flux magnetization pattern) may then be generated spontaneously in the pinned layer (and, in turn, the first closed flux magnetization pattern may be generated in the magnetic reference layer). Without an additional external magnetic field, a temperature budget (e.g., 280° C. for two hours) with a temperature preferably smaller than the blocking temperature may next be applied to the magnetic layer stack to form the antiferromagnetic phase of the natural antiferromagnetic layer. Afterwards, the magnetic layer stack can be cooled down again. The vortex-like magnetization of the pinned layer (e.g., the second closed flux magnetization pattern) of the magnetic reference system may then be pinned to the natural antiferromagnetic layer by an exchange bias coupling force.

An alternative approach for pinning the second closed flux magnetization to the natural antiferromagnetic layer can comprise forming an antiferromagnetic phase of the natural antiferromagnetic layer and increasing thereafter the temperature of the magnetic layer stack to above the blocking temperature of the natural antiferromagnetic layer and the pinned layer prior to applying 710 the external magnetic field. Furthermore, this approach can comprise keeping the temperature of the magnetic layer stack above the blocking temperature during applying 710 the external magnetic field.

This alternative procedure for the formation of a vortex-like magnetization in a magnetic reference system can, for instance, be applied in the case when an antiferromagnetic phase of the natural antiferromagnetic layer and hence the exchange bias coupling is already present after magnetic layer stack deposition (e.g., for iridium-manganese (IrMn) as the material of the natural antiferromagnetic layer). A temperature above the blocking temperature can be applied to the magnetic layer stack. The exchange bias coupling can then vanish and the magnetic reference system can behave like free (e.g., above the blocking temperature the magnetization of the pinned layer is not pinned to the natural antiferromagnetic layer). For example, the blocking temperature for iridium-manganese as the natural antiferromagnetic layer material can range from about 250° C. to 350° C., while the blocking temperature for platinum-manganese as the natural antiferromagnetic layer material can range from about 350° C. to 400° C.

While the temperature of the magnetic layer stack is kept above the blocking temperature, the external magnetic field can be applied 710 to the magnetic layer stack causing saturation of the device (e.g., the magnetic layer stack). Subsequently, the external magnetic field can be reduced again (e.g., at least below a nucleation field strength of the magnetic reference layer and of the pinned layer). For example, the external magnetic field may be switched off. The vortex-like magnetization (e.g., the first and the second closed flux magnetization pattern) may then be generated spontaneously. Thereafter, the temperature of the magnetic layer stack can be reduced from above the blocking temperature to below the blocking temperature to fix the pinned layer magnetization (e.g., to pin the second closed flux magnetization pattern to the natural antiferromagnetic layer by exchange bias coupling forces).

Additionally, the method 700 may comprise structuring a magnetic free layer of the magnetic layer stack to cause a lateral displacement of a centroid of the magnetic free layer (or of centroids of laterally separated parts of the magnetic free layer) with respect to a centroid of the magnetic reference layer (or with respect to centroids of laterally separated parts of the magnetic reference layer).

Additionally, the method 700 may comprise forming an electrically conductive via through a tunnel barrier layer of the magnetic layer stack. The electrically conductive via may connect a laterally separated part of the magnetic free layer and the magnetic reference layer. In addition, the method 700 may comprise conducting a current between the laterally separated part of the magnetic free layer and the natural antiferromagnetic layer through the electrically conductive via. A direction of the current (e.g., from the magnetic free layer to the natural antiferromagnetic layer or vice versa) can set the rotational direction of a magnetic field that encircles the current and is in plane with the magnetic reference layer and the pinned layer. The rotational direction of this magnetic field may then set (e.g., predetermine) the rotational direction of the first closed flux magnetization pattern in the magnetic reference layer and/or of the second closed flux magnetization pattern in the magnetic reference layer. Optionally, the electrically conductive via can be formed vertically above (or, depending on the build-up of the magnetic layer stack, vertically below) a centroid of the magnetic reference layer.

According to an example, the process for the formation of the reference layer can include the following steps: Firstly, bringing the element into hot state and applying an external field that saturates the device; secondly, reducing the field to a level where a vortex is formed; thirdly, reducing the field and the temperature; fourthly letting the field reach zero while the temperature is still sufficient to set up the (anti-ferromagnet) reference layer orientation; and fifthly cooling down the device completely causing the (anti-ferromagnet) reference layer to be pinned in a vortex state.

According to another aspect of the present disclosure, it is provided a vortex magnetized reference layer for angle sensors. This can allow building angle sensors without local magnetization process for the definition of pinned layer magnetization. This can comprise using different structure geometries of the pinned layer, of the reference system and/or of the free layer of an xMR sensor structure. The pinned layer and/or the reference system can exhibit a vortex-like and/or closed-flux magnetization. The free layer area can differ from the pinned layer area. The free layer can be configured to select a certain area of the pinned layer and/or of the reference system to be sensitive to a certain magnetic field component. The position of the free layer area on the pinned layer and/or the reference system area can define the sensitive direction.

For example, TMR based structures with free layer regions on a closed-flux magnetized pinned layer can be used to get measurements of magnetic field components in different directions, wherein the free layer extensions differ from the pinned layer extensions (e.g., free layer<pinned vortex layer). This can avoid individual magnetization steps for the formation of TMR sensor elements with different pinned reference directions. The elements can be connected to form a bridge being functionally compatible to other magnetoresistive angle sensors. The amount of series connected elements can be higher than the 2 in each branch of the bridge, for example.

Another example of the present disclosure relates to a TMR structure with a pinned layer and/or reference system having a vortex-like magnetization and a free layer extending only above (or below) a part of the pinned layer/reference system (differently structured free layer). This can reduce TMR fabrication costs due to saved laser magnetization steps, for example.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for generating closed flux magnetization patterns of predetermined rotational directions in a magnetic reference layer and a pinned layer of a magnetic layer stack, the method comprising:
    applying an external magnetic field in a predetermined direction to the magnetic layer stack causing magnetic saturation of the magnetic reference layer and of the pinned layer of the magnetic layer stack; and
    reducing the external magnetic field to form a first closed flux magnetization pattern in the magnetic reference layer and a second closed flux magnetization pattern in the pinned layer.

2. The method of claim 1, further comprising:
    pinning the second closed flux magnetization pattern to a natural antiferromagnetic layer of the magnetic layer stack.

3. The method of claim 2, further comprising:
    maintaining a temperature of the magnetic layer stack below 200° C. during applying the external magnetic field; and
    after reducing the external magnetic field, increasing the temperature of the magnetic layer stack to above 240° C. but not exceeding a blocking temperature of the natural antiferromagnetic layer and the pinned layer, and keeping the temperature above 240° C. for more than one hour to form an antiferromagnetic phase within the natural antiferromagnetic layer causing an exchange bias coupling between the natural antiferromagnetic layer and the pinned layer.

4. The method of claim 2, further comprising:
    forming an antiferromagnetic phase of the natural antiferromagnetic layer and increasing thereafter a temperature of the magnetic layer stack to above a blocking temperature of the natural antiferromagnetic layer and the pinned layer prior to applying the external magnetic field; and
    maintaining the temperature of the magnetic layer stack above the blocking temperature during applying the external magnetic field.

5. The method of claim 1, further comprising:
    structuring, prior to applying the external magnetic field, at least the magnetic reference layer to have a lateral cross section that comprises a main portion and a protrusion portion laterally adjacent to the main portion, wherein the external magnetic field is applied in parallel to the protrusion portion.

6. The method of claim 5, wherein the protrusion portion extends laterally from the main portion in a lateral direction that is orthogonal to a stacking direction of the magnetic layer stack.

7. The method of claim 1, wherein reducing the external magnetic field to form the first closed flux magnetization pattern in the magnetic reference layer and the second closed flux magnetization pattern in the pinned layer is performed subsequent to causing the magnetic saturation of the magnetic reference layer and of the pinned layer of the magnetic layer stack.

8. The method of claim 1, wherein applying the external magnetic field in the predetermined direction to the magnetic layer stack includes setting a strength of the external magnetic field to be greater than an annihilation field strength of the magnetic reference layer and to be greater than an annihilation field strength of the pinned layer causing the magnetic saturation of the magnetic reference layer and of the pinned layer of the magnetic layer stack.

9. The method of claim 8, wherein reducing the external magnetic field includes setting a strength of the external magnetic field to be less than a nucleation field strength of the magnetic reference layer and to be less than a nucleation field strength of the pinned layer.

10. The method of claim 1, wherein, during magnetic saturation, a magnetization of the magnetic reference layer and a magnetization of the pinned layer are unidirectional.

11. The method of claim 1, wherein the first closed flux magnetization pattern in the magnetic reference layer is a first closed loop pattern having a first predetermined rotational direction, and
    wherein the second closed flux magnetization pattern in the pinned layer is a second closed loop pattern having a second predetermined rotational direction.

12. A method for manufacturing a magnetoresistive sensor that includes a magnetic layer stack comprising a magnetic reference layer, a pinned layer, and a magnetic free layer, the method comprising:
generating a closed flux magnetization pattern of a predetermined rotational direction in the magnetic reference layer; and
forming the magnetic free layer on the magnetic reference layer, wherein the magnetic free layer has a total lateral area that is smaller than a total lateral area of the magnetic reference layer, and wherein a centroid of the magnetic free layer is laterally displaced with respect to a centroid of the magnetic reference layer.

13. The method of claim 12, wherein generating the closed flux magnetization pattern of the predetermined rotational direction in the magnetic reference layer comprises:
applying an external magnetic field in a predetermined direction to the magnetic layer stack causing magnetic saturation of the magnetic reference layer and of the pinned layer; and
subsequent to causing the magnetic saturation of the magnetic reference layer and of the pinned layer, reducing the external magnetic field to form a first closed flux magnetization pattern in the magnetic reference layer and a second closed flux magnetization pattern in the pinned layer.

14. The method of claim 13, further comprising:
structuring, prior to applying the external magnetic field, at least the magnetic reference layer to have a lateral cross section that comprises a main portion and a protrusion portion laterally adjacent to the main portion, wherein the external magnetic field is applied in parallel to the protrusion portion.

15. The method of claim 14, wherein the main portion comprises the first closed flux magnetization pattern, and wherein a magnetization pattern of the protrusion portion is configured to determine the predetermined rotational direction of the first closed flux magnetization pattern.

16. The method of claim 15, wherein, in proximity to a lateral joining of the protrusion portion and the main portion, the magnetization pattern of the protrusion portion is directed opposite to the first closed flux magnetization pattern of the main portion.

17. The method of claim 15, wherein a length of the protrusion portion is larger than twice a width of the protrusion portion.

18. The method of claim 15, wherein the protrusion portion extends tangentially to the main portion.

19. The method of claim 15, wherein the main portion has a rotationally symmetric lateral cross section.

20. The method of claim 12, wherein a direction of the closed flux magnetization pattern vertically above or below at least a part of the magnetic free layer changes by at most 90°.

21. The method of claim 12, further comprising:
forming a tunnel barrier layer between the magnetic reference layer and the magnetic free layer; and
forming an electrically conductive via that connects a part of the magnetic free layer with the magnetic reference layer through the tunnel barrier layer, wherein the part of the magnetic free layer is laterally surrounded by electrically insulating material.

22. The method of claim 21, wherein the electrically conductive via is located vertically above the centroid of the magnetic reference layer.

* * * * *